United States Patent
Immink et al.

(10) Patent No.: US 7,286,064 B2
(45) Date of Patent: Oct. 23, 2007

(54) TWO-DIMENSIONAL MODULATION ENCODING FOR HIGH DENSITY OPTICAL STORAGE

(75) Inventors: Albert Hendrik Jan Immink, Eindhoven (NL); Willem Marie Julia Marcel Coene, Eindhoven (NL)

(73) Assignee: Koninklijke Philips Electronics N. V., Eindhoven (NL)

( * ) Notice: Subject to any disclaimer, the term of this patent is extended or adjusted under 35 U.S.C. 154(b) by 15 days.

(21) Appl. No.: 10/557,639

(22) PCT Filed: May 17, 2004

(86) PCT No.: PCT/IB2004/050722

§ 371 (c)(1),
(2), (4) Date: Nov. 17, 2005

(87) PCT Pub. No.: WO2004/105252

PCT Pub. Date: Dec. 2, 2004

(65) Prior Publication Data

US 2007/0030912 A1    Feb. 8, 2007

(30) Foreign Application Priority Data

May 21, 2003    (EP)  ................................ 03101439

(51) Int. Cl.
*H03M 5/00*      (2006.01)
*H03M 13/00*    (2006.01)

(52) U.S. Cl. ............................. 341/58; 341/94; 341/68
(58) Field of Classification Search ................. 341/58, 341/50, 74, 73, 94, 68, 69
See application file for complete search history.

(56) References Cited

U.S. PATENT DOCUMENTS

| 6,543,697 | B1 * | 4/2003 | Imade et al. ................. 235/494 |
| 6,556,679 | B1 * | 4/2003 | Kato et al. ................... 380/203 |
| 6,651,893 | B2 * | 11/2003 | He et al. ..................... 235/494 |
| 6,729,542 | B2 * | 5/2004 | Iwai et al. ............. 235/462.08 |

* cited by examiner

*Primary Examiner*—Peguy JeanPierre
(74) *Attorney, Agent, or Firm*—Michael E. Belk

(57) ABSTRACT

The present invention relates to an encoding apparatus and a corresponding method for two-dimensionally encoding user data of a user data stream into channel data of a channel data stream along a two-dimensional channel strip of at least two bit rows one-dimensionally evolving along a first direction and being aligned with each other along a second direction, said two directions constituting a two-dimensional lattice of bit positions. According to the invention the apparatus comprises a modulation code encoder for modulation code encoding said user data into said channel data according to a two-dimensional modulation code being adapted to prevent predetermined worst case patterns of channel data in said channel data stream. The worst-case patterns are typical for high-density two-dimensional optical storage channels.

17 Claims, 22 Drawing Sheets

Figure 1:
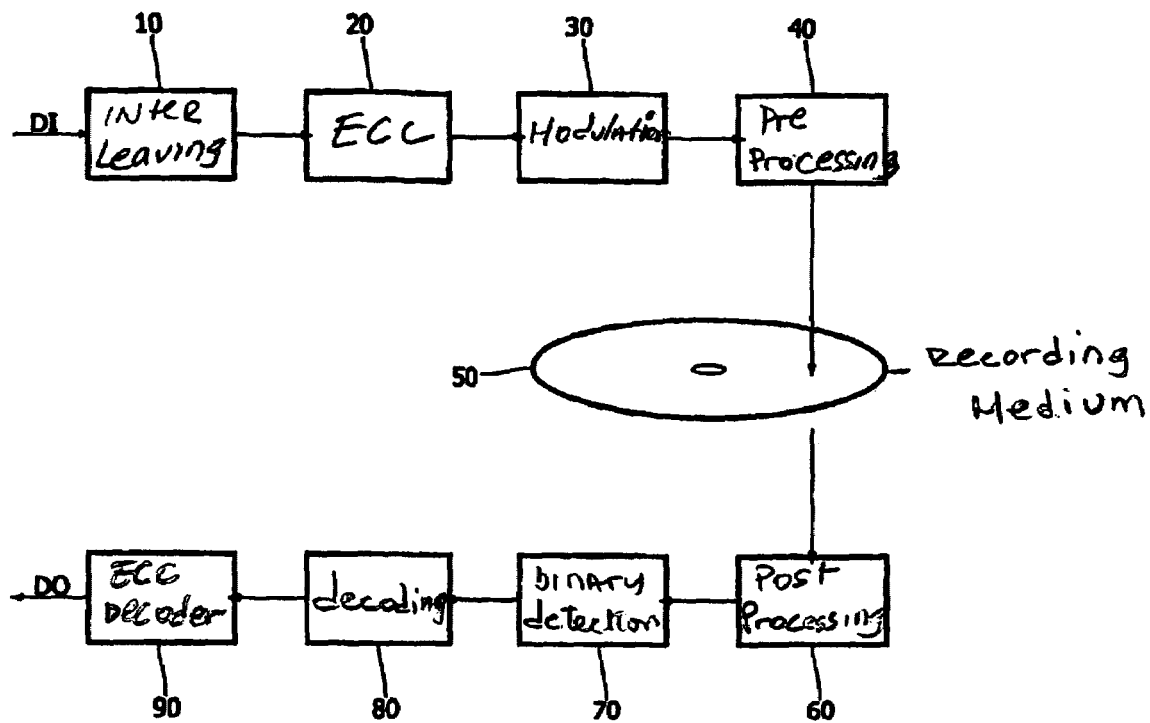

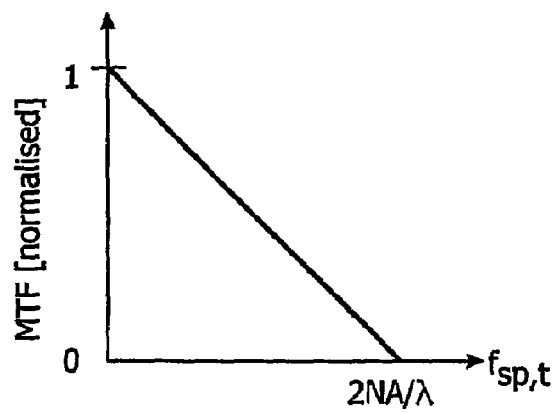 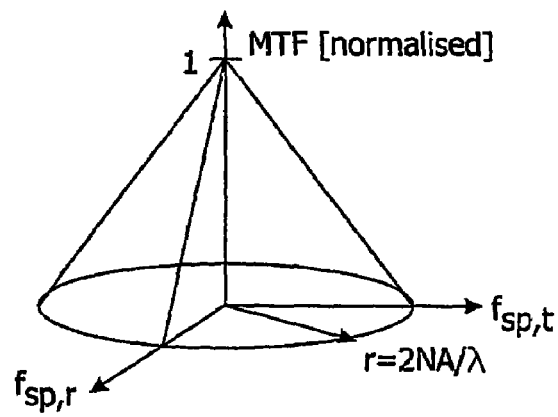
FIG.3a  FIG.3b
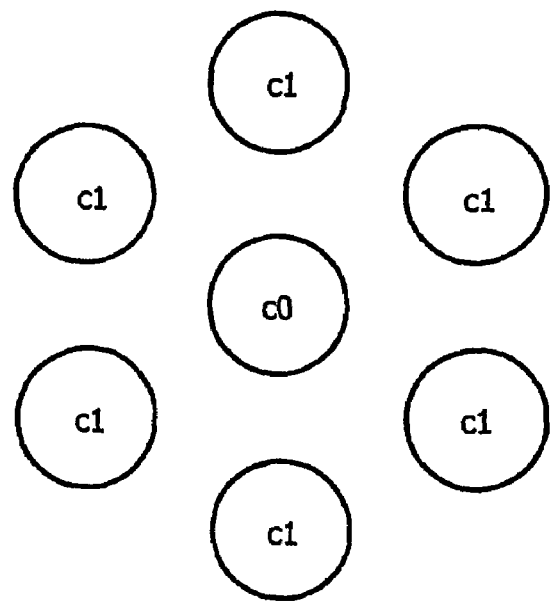
FIG.4

| STD-State σ1 | STD-State σ2 | STD-State σ3 | STD-State σ4 |
|---|---|---|---|
| x / x \ x | x / y \ y | x / y \ x | x / x \ y |

FIG.10

| Current NRZI triplet | Channel symbol | Next NRZI triplet |
|---|---|---|
| $b_{i1}$ | →i→ | $b_{i2} = b_{i1}(-1)^i$ |
| $b_{j1}$ | →j→ | $b_{j2} = b_{j1}(-1)^j$ |
| $b_{k1}$ | →k→ | $b_{k2} = b_{k1}(-1)^k$ |

FIG.11

| rep. period | 3 | 5 |
|---|---|---|
| pat.1 | 0 1 0<br>1 0 0<br>0 1 0 | 0 1 0 1 0<br>1 0 0 0 0<br>0 1 1 1 0 |
| pat.2 | 1 0 1<br>0 1 1<br>1 0 1 | 1 0 0 0 1<br>0 1 1 1 1<br>1 0 1 0 1 |

FIG.12

| STD | Symbol | | | | | | | |
|---|---|---|---|---|---|---|---|---|
| | [0] | [1] | [2] | [3] | [4] | [5] | [6] | [7] |
| $\sigma_1$ | $\sigma_1$ | $\sigma_2$ | $\sigma_7$ | $\sigma_4$ | $\sigma_4$ | $\sigma_3$ | $\sigma_2$ | $\sigma_1$ |
| $\sigma_2$ | $\sigma_2$ | $\sigma_1$ | $\sigma_4$ | $\sigma_3$ | $\sigma_3$ | $\sigma_4$ | $\sigma_1$ | $\sigma_2$ |
| $\sigma_3$ | $\sigma_3$ | $\sigma_4$ | $\sigma_1$ | $\sigma_2$ | $\sigma_2$ | $\sigma_6$ | $\sigma_4$ | $\sigma_5$ |
| $\sigma_4$ | $\sigma_4$ | $\sigma_3$ | $\sigma_2$ | $\sigma_1$ | $\sigma_1$ | $\sigma_2$ | $\sigma_3$ | $\sigma_4$ |
| $\sigma_5$ | $\sigma_3$ | $\sigma_4$ | $\sigma_1$ | $\sigma_2$ | $\sigma_2$ | X | $\sigma_4$ | $\sigma_5$ |
| $\sigma_6$ | $\sigma_1$ | $\sigma_2$ | X | $\sigma_4$ | $\sigma_4$ | $\sigma_3$ | $\sigma_2$ | $\sigma_1$ |
| $\sigma_7$ | $\sigma_3$ | $\sigma_4$ | $\sigma_1$ | $\sigma_2$ | $\sigma_2$ | $\sigma_6$ | $\sigma_4$ | X |

FIG.15

| STD | $\sigma_1$ | $\sigma_2$ | $\sigma_3$ | $\sigma_4$ | $\sigma_5$ | $\sigma_6$ | $\sigma_7$ |
|---|---|---|---|---|---|---|---|
| $\sigma_1$ | 2 | 2 | 1 | 2 | 0 | 0 | 1 |
| $\sigma_2$ | 2 | 2 | 2 | 2 | 0 | 0 | 0 |
| $\sigma_3$ | 1 | 2 | 1 | 2 | 1 | 1 | 0 |
| $\sigma_4$ | 2 | 2 | 2 | 2 | 0 | 0 | 0 |
| $\sigma_5$ | 1 | 2 | 1 | 2 | 1 | 0 | 0 |
| $\sigma_6$ | 2 | 2 | 1 | 2 | 0 | 0 | 0 |
| $\sigma_7$ | 1 | 2 | 1 | 2 | 0 | 1 | 0 |

= D

FIG.16

| STD | $\sigma_1$ | $\sigma_2$ | $\sigma_3$ | $\sigma_4$ | $\sigma_5$ | $\sigma_6$ | $\sigma_7$ | $\sigma_1'$ | $\sigma_2'$ | $\sigma_3'$ | $\sigma_4'$ | $\sigma_5'$ | $\sigma_6'$ | $\sigma_7'$ |
|---|---|---|---|---|---|---|---|---|---|---|---|---|---|---|
| $\sigma_1$ | 1 | 2 | 1 | 2 | 0 | 0 | 1 | 1 | 0 | 0 | 0 | 0 | 0 | 0 |
| $\sigma_2$ | 2 | 1 | 2 | 2 | 0 | 0 | 0 | 0 | 1 | 0 | 0 | 0 | 0 | 0 |
| $\sigma_3$ | 1 | 2 | 0 | 2 | 1 | 1 | 0 | 0 | 0 | 1 | 0 | 0 | 0 | 0 |
| $\sigma_4$ | 2 | 2 | 2 | 1 | 0 | 0 | 0 | 0 | 0 | 0 | 1 | 0 | 0 | 0 |
| $\sigma_5$ | 1 | 2 | 0 | 2 | 1 | 0 | 0 | 0 | 0 | 1 | 0 | 0 | 0 | 0 |
| $\sigma_6$ | 1 | 2 | 1 | 2 | 0 | 0 | 0 | 1 | 0 | 0 | 0 | 0 | 0 | 0 |
| $\sigma_7$ | 1 | 2 | 0 | 2 | 0 | 1 | 0 | 0 | 0 | 1 | 0 | 0 | 0 | 0 |
| $\sigma_1'$ | 1 | 2 | 1 | 2 | 0 | 0 | 1 | 0 | 0 | 0 | 0 | 0 | 0 | 0 |
| $\sigma_2'$ | 2 | 1 | 2 | 2 | 0 | 0 | 0 | 0 | 0 | 0 | 0 | 0 | 0 | 0 |
| $\sigma_3'$ | 1 | 2 | 0 | 2 | 1 | 1 | 0 | 0 | 0 | 0 | 0 | 0 | 0 | 0 |
| $\sigma_4'$ | 2 | 2 | 2 | 1 | 0 | 0 | 0 | 0 | 0 | 0 | 0 | 0 | 0 | 0 |
| $\sigma_5'$ | 1 | 2 | 0 | 2 | 1 | 0 | 0 | 0 | 0 | 0 | 0 | 0 | 0 | 0 |
| $\sigma_6'$ | 1 | 2 | 1 | 2 | 0 | 0 | 0 | 0 | 0 | 0 | 0 | 0 | 0 | 0 |
| $\sigma_7'$ | 1 | 2 | 0 | 2 | 0 | 1 | 0 | 0 | 0 | 0 | 0 | 0 | 0 | 0 |

= D

FIG.17

| $x_1$ | $x_2$ | $x_3$ | $i_S(x)$ |
|---|---|---|---|
| 0 | 0 | 0 | 0 |
| 0 | 0 | 1 | $1.n_S(0,0,0) = 1.1 = 1$ |
| 0 | 1 | 0 | $1.n_S(0,0) = 1.2 = 2$ |
| 0 | 1 | 1 | $1.n_S(0,0) + 1.n_S(0,1,0) = 2+1 = 3$ |
| 1 | 0 | 0 | $1.n_S(0) = 4$ |
| 1 | 0 | 1 | $1.n_S(0) + 1.n_S(1,0,0) = 4+1 = 5$ |
| 1 | 1 | 0 | $1.n_S(0) + 1.n_S(1,0) = 4+2 = 6$ |
| 1 | 1 | 1 | $1.n_S(0) + 1.n_S(1,0) + 1.n_S(1,1,0) = 4+2+1 = 7$ |

$$\begin{matrix} & & 0 & & 0 & & \\ 0 & & 1 & & & & 0 \\ & -1 & & & -1 & & \\ 0 & & 0 & & & & 0 \\ & 1 & & & 1 & & \\ 0 & & -1 & & & & 0 \\ & & 0 & & 0 & & \end{matrix}$$

FIG.27a $$\begin{matrix}
0.0057 & 0 & 0.0339 & 0 & 0.0339 & 0 & 0.0057 \\
0 & -0.0339 & 0 & 0.3607 & 0 & -0.0339 & 0 \\
0.0254 & 0 & 0.0000 & 0 & 0.0000 & 0 & 0.0254 \\
0 & -0.3607 & 0 & 0.2407 & 0 & -0.3607 & 0 \\
-0.0339 & 0 & -0.2407 & 0 & -0.2407 & 0 & -0.0339 \\
0 & 0 & 0 & 0 & 0 & 0 & 0 \\
0.0339 & 0 & 0.2407 & 0 & 0.2407 & 0 & 0.0339 \\
0 & 0.3607 & 0 & -0.2407 & 0 & 0.3607 & 0 \\
-0.0254 & 0 & -0.0000 & 0 & -0.0000 & 0 & -0.0254 \\
0 & 0.0339 & 0 & -0.3607 & 0 & 0.0339 & 0 \\
-0.0057 & 0 & -0.0339 & 0 & -0.0339 & 0 & -0.0057
\end{matrix}$$

FIG.27b

TWO-DIMENSIONAL MODULATION ENCODING FOR HIGH DENSITY OPTICAL STORAGE

The present invention relates to an encoding apparatus for two-dimensionally encoding user data of a user data stream into channel data stream along a two-dimensional channel strip of at least two bit rows one dimensionally evolving along a first direction and being aligned with each other along a second direction, said two directions constituting a two-dimensional lattice of bit positions. The present invention relates further to a corresponding encoding method and a computer program for implementing said method on a computer.

In one-dimensional recording on optical discs the channel bits of the channel data stream are recorded along a spiral track, the spiral being one bit wide. For two-dimensional recording the channel bits of a channel data stream can also be recorded along a spiral, albeit a broad spiral, that consists of a number of bit rows which are aligned with respect to each other in the radial direction, that is, in the direction orthogonal to the spiral direction.

European patent application 01203878.2 (ID 607133) discloses a method and system for multi-dimensionally coding and/or decoding an information to/from a lattice structure representing channel bit positions of said coded information in at least two dimensions. Encoding and/or decoding is performed by using a quasi close-packed lattice structure. For the case of two-dimensional encoding and/or decoding, preferably a quasi-hexagonal lattice structure is to be used.

Further, European patent application 02076665.5 (PHNL 020368) discloses a method of multi-dimensionally encoding a user data stream of user words into a channel data stream of channel words evolving in a one-dimensional direction of infinite extent. Further, a corresponding method of decoding is disclosed. The code disclosed in European patent application 02076665.5 (PHNL 020368) is based on a finite-state machine. In order to implement certain two- or multi-dimensional coding constraints and coding geometries which lead to higher storage densities and improve the coding efficiency, the method of encoding according to the finite-state machine encoder, comprises the following steps:

a user word is encoded into an NRZ channel word by selecting said NRZ channel word from a code table depending on said user word and the current state of the underlying finite-state-machine, wherein an NRZ channel word comprises a sequence of NRZ channel symbols of NRZ channel bits having a one-dimensional interpretation along said one-dimensional direction and wherein states of the underlying finite-state-machine describing the characteristics of the multi-dimensional code are defined by NRZI channel bits of the previous channel word and by NRZ channel symbols of the current channel word, the NRZ channel symbols are transcoded into NRZI channel symbols by a one-dimensional 1T-precoding operation including an integration modulo 2, said 1T-precoding operation being carried out along said one-dimensional direction of infinite extent, and said finite-state-machine is put into a new state selected from said code table depending on said user word and the current state of said finite-state-machine together with encoding a user word into a channel word.

In the one-dimensional case a modulation transfer function (MTF) determines the amount of inter-symbol interference and the achievable linear density of an encoding apparatus along the track direction. The modulation code is designed for data evolving in the direction along the track in such a way that the spectral content of the data is transmitted properly by the low-pass optical channel. Therefore, the MTF is considered as a one-dimensional function. For the two-dimensional case, however, data evolve in all directions in the same way. The shape of MTF is equally important in all directions when a 2D modulation code is designed. Thus, the MTF must be considered as a two-dimensional function, for instance as the auto-correlation function of a circular top-hat function having a particular radius, i.e. where the base of the MTF is a circle which can be treated as the equivalence of a cut-off frequency beyond which no information is transferred by the channel. The interpretation of the MTF as the auto-correlation of a circular top-hat that represents the detection aperture used in optical recording is described in J. Braat, "Read-out of Optical Discs", in "Principles of Optical Disc Systems", pp. 7-87, Adam Hilger Ltd., Bristol, 1985. This MTF is typical for so-called "Central-Aperture" detection, which is preferably used for two-dimensional optical storage.

For two-dimensional high-density storage, it has now been found that the two-dimensional frequency space can not be covered fully by the bases of several modulation transfer functions, i.e. by drawing a number of touching circles. The two-dimensional frequency space consists of a periodic repetition in 2D of the fundamental domain in frequency space (which is called the 2D Nyquist cell). For a 2D hexagonal bit-lattice, the 2D Nyquist cell has an hexagonal shape. The circle which is the base of the MTF will at high enough density not completely cover the full 2D Nyquist cell. As a consequence, there are frequency components in the signal that are not transmitted by the modulation transfer function at a combination of chosen density and optical parameters. Moreover, it has been found that there are a number of further so-called worst case patterns that correspond to these frequency components, having a high probability to be detected erroneously when transmitted across an optical channel for two-dimensional optical storage.

It is thus an object of the present invention to provide an encoding apparatus and a corresponding encoding method which avoid the above described problem and ensure that only data patterns are generated by the encoding apparatus and method which have a high probability of being detected correctly by a decoder after being transmitted across an optical channel, which can, for instance, be a transmission network like the internet or a record carrier like a CD or DVD or any other channel with a hard cut-off for the modulation transfer characteristic.

This object is achieved according to the present invention by an encoding apparatus as claimed in claim 1 which comprises a modulation code encoder for modulation code encoding the user data into channel data according to a two-dimensional modulation code being adapted to prevent predetermined worst case patterns of channel data in the channel data stream.

The present invention is based on the idea to avoid the generation of such worst case patterns as soon and as much as possible during modulation code encoding. Therefore, these worst case patterns are predetermined in advance or conditions are defined which correspond to the existence or generation of such worst case patterns which are known to the encoding apparatus so that the encoding apparatus is equipped with appropriate measures so that generation of any worst case pattern is prohibited. Preferred embodiments of such worst case patterns and appropriate measures for prohibiting the generation thereof are defined in the dependent claims.

According to one aspect of the invention worst case patterns shall be prevented that include local periodic patterns having fundamental frequency components outside the circle formed by the base of the two-dimensional optical modulation transfer function. Periodic patterns are defined as patterns that have a base on a hexagonal, orthogonal or any other lattice, i.e. having base vectors which are linear and integer combinations of the base vectors of the hexagonal, orthogonal or any other lattice. These (local) periodic patterns are also denoted as super-structures. Upon Fourier transformation of these (local) periodic patterns a periodic lattice is obtained in Fourier space. Frequency components outside the circle are then understood as points of this Fourier lattice that are outside the circle formed by the cut-off frequency of the modulation transfer function. For obvious reasons of efficiently high data storage, the circle is as small as possible with respect to the extent of the 2D fundamental domain, but preferably (in the hexagonal case), has a size such that the circle just touches on the fundamental hexagon (or 2D Nyquist cell) that is the result of the Fourier transform of the hexagonal lattice itself and is completely contained in this fundamental hexagon. Since worst case patterns having frequency components outside the circle have a high probability of not being detected by a decoder, these shall be prohibited during encoding.

Among those worst case patterns are patterns which lead to zero HF signal at synchronous sampling moments for a particular target response. Such patterns have circular symmetry, for instance a one in the middle and three surrounding one-bits and three surrounding zero-bits. Because the channel is circular symmetric this always leads to the same HF signal, and no modulation is present at the output.

According to another aspect of the invention worst case patterns shall be prevented that form a closed ring of bit symbols having alternating bit values or form an open ring of bit symbols having alternating bit values at a boundary of the channel data stream where the opening of the ring is at the side of the boundary of the 2D storage area These patterns are characterized by the fact that the Euclidean weight of the transmitted error pattern across the optical channel is small. These kinds of worst case patterns have a high loss with respect to the matched filter bound.

In a preferred embodiment of the invention the modulation code encoder comprises a state-transition machine, also called state-transition diagram, describing the flow of channel words in the direction of evolution of the channel code, for prevention of said worst case patterns by checking the building up of a worst case pattern during modulation code encoding and by truncating a sequence of channel words building up the start of a worst case pattern by entering a state of the encoding apparatus and its state-transition diagram that forbids the emission of a NRZ channel symbol that leads to a further continuation of the worst case pattern. Thus, it is very effectively and very soon detected if a worst case pattern that shall be suppressed is being built up so that it will not be generated completely, but the building up is interrupted. To achieve this, an appropriate state-transition diagram is used.

A preferred embodiment of such a state-transition diagram is defined in claim 5 according to which the state-transition diagram comprises a state conversion unit for putting said diagram state-transition diagram into a new state generated depending on said NRZ channel symbol and the current state of said state-transition diagram together with encoding a user word into a channel word, said generation method being based on an extended state transition diagram having a number of STD-states comprising at least one pair of STD-states having an identical fan-out except for NRZI channel symbols that lead to a next NRZ channel symbol of a worst case pattern. Additional states are thus added to the normal STD-states of the state transition diagram in order to generate the extended state-transition diagram on which the code construction will be based, said additional states having no fan-out for NRZI channel symbols that further build up worst case patterns.

It is further preferred that the modulation code encoder comprises a channel word conversion unit for transcoding the NRZ channel symbols into NRZI channel symbols by a one-dimensional 1T-precoding operation including an integration modulo 2, said 1T-precoding operation being carried out along said one-dimensional direction of infinite extent. Such a channel word conversion unit and a one-dimensional 1T-precoding operation are generally known per se, for instance from the above mentioned European patent application 02 076 665.5 (PHNL 020368).

It can also be advantageous that the modulation code encoder is adapted for implementing a radial and/or tangential k-constraint by adding further STD-states in the state transition diagram having no fan-out for predetermined NRZI channel symbols.

A tangential k-constraint is similar to the k-constraint in conventional 1D modulation encoding. The k-constraint limits the number of NRZ zeroes between successive NRZ ones, which indicate the transitions in the channel bitstream, to a maximum of k. Therefore, the longest allowed run-lengths are k+1 bits long. The limitation on the occurrence of very long runs is needed since the latter lead to inaccuracies in the timing recovery, which is dealt with by a device called a phase-locked loop (PLL). The PLL regenerates the internal "clock" that is matched to the length of the bits on the medium: the bit clock is adjusted at each occurrence of a transition. Areas on the medium with too few transitions may cause "clock-drift". So, in order to retrieve the bit-clock, the receiver needs some changes in the bitstream at a large enough pace. For instance, in the EFMPlus code used in DVD, k=10 has been used. Similar requirements for timing recovery hold in 2D optical storage based on a broad spiral. In order to retrieve the tangential bit-clock, the number of NRZ 0-symbols (where one symbol comprises a bit for each bit-row in the strip to be encoded) is limited to a small number. For the radial direction, that is orthogonal to the direction of evolution of the road spiral, it is advantageous to have a similar k-constraint resulting in changes of the bit-patterns in the radial direction.

Advantageously the modulation code encoder is adapted for use of enumerative encoding for modulation code encoding according to the invention since the rate of the codes that relate to prohibiting said worst-case patterns is very high. Therefore, the code-mapping from user bits to channel bits typically requires the use of very long user words and very long channel words to achieve a code with high efficiency. One channel word can therefore consist of a large number of NRZ channel symbols. Since preferably the user word is quite large (for instance 152 bits for a channel word of 153 channel bits, thus 51 channel symbols for a 3-row strip), it is nearly impossible to realize this by using a look-up table or code-table in the form of a memory: this makes the use of a conventional code with a number of code-tables dependent on the underlying finite-state machine completely impractical. Therefore, the NRZ channel symbol is generated based on the user word by an algorithm that is called enumerative encoding which is known per se (see T. M. Cover, "Enumerative Source Coding", IEEE Transactions on Information Theory, Vol. IT-19, No. 1, pp. 73-77, January 1973). This algorithm can be carried out in real-time and can be implemented in hardware.

Advantageously, the invention is applicable in a code having a high code rate, for instance in a 152 to 153 code for the case $k_f=2$. However, of course, the invention can be applied in other codes as well.

Figure 5:
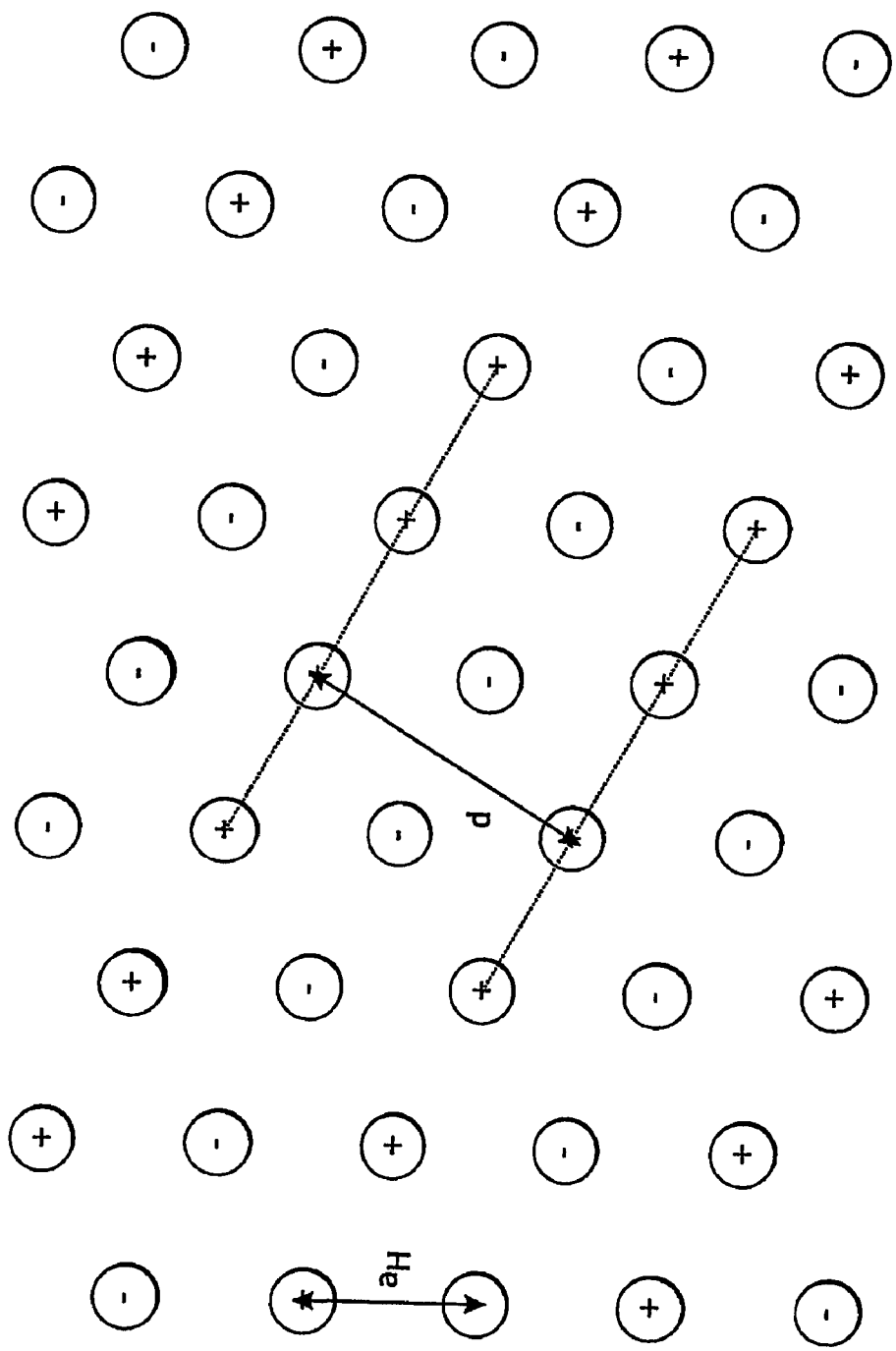
Figure 6:
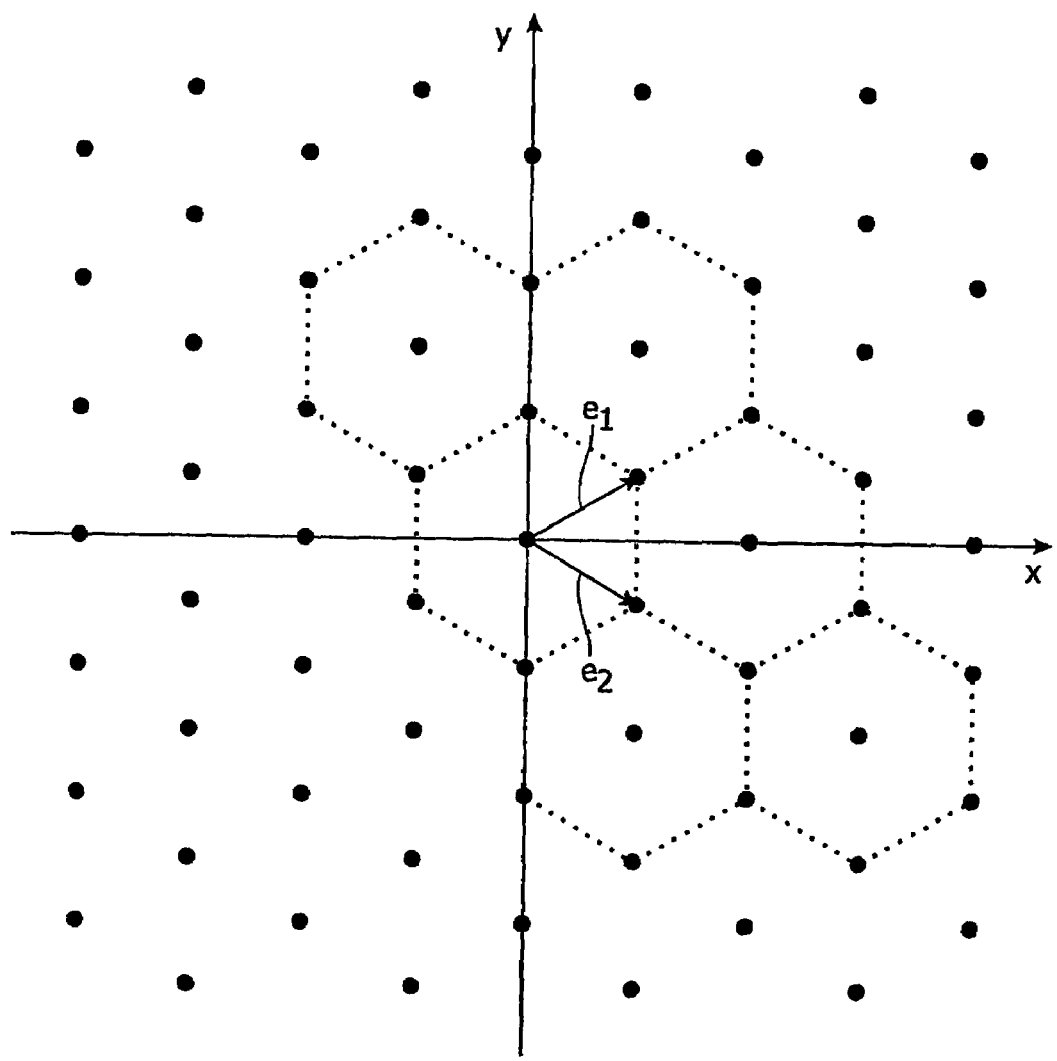
Figure 7:
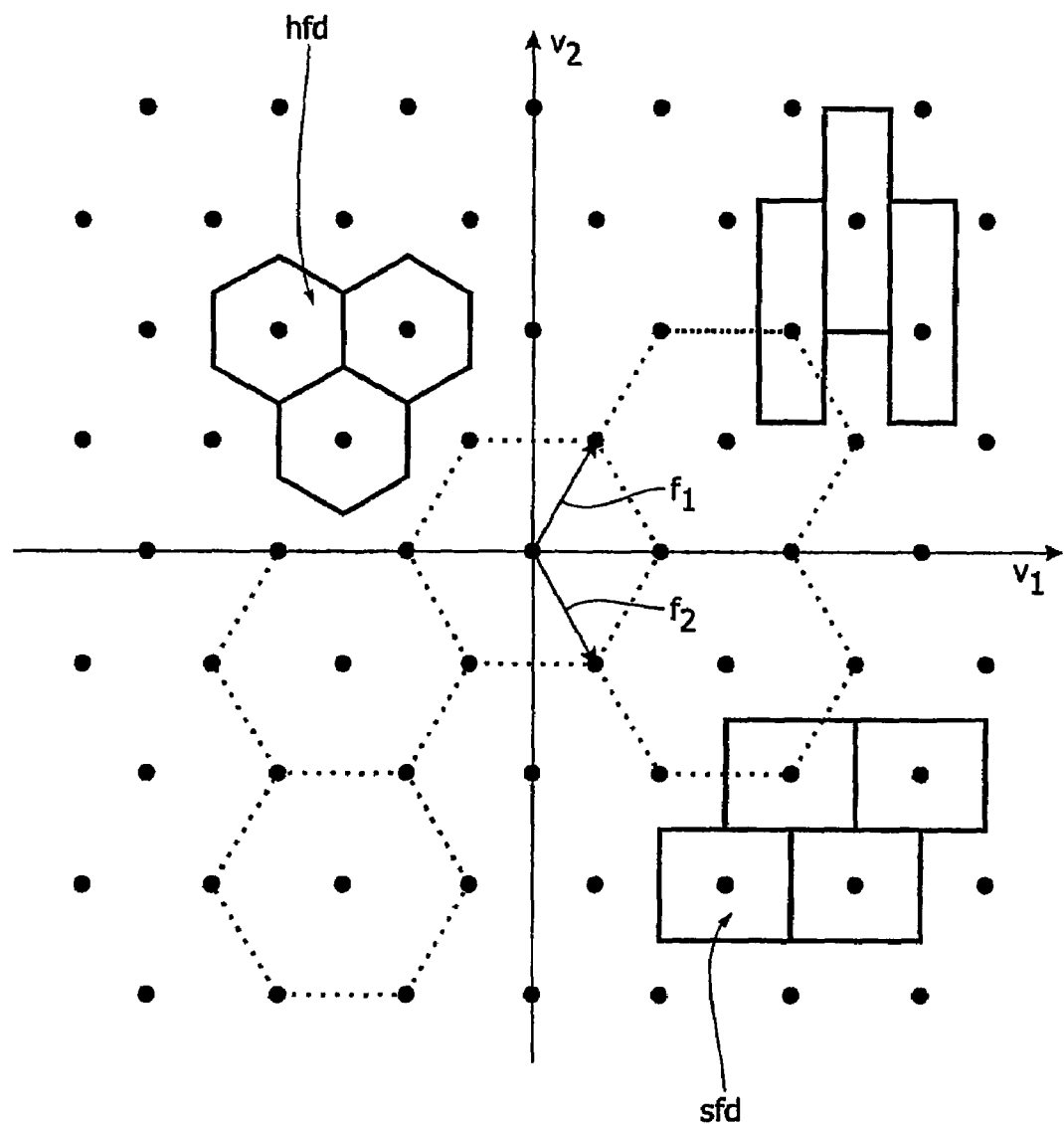
Figure 8:
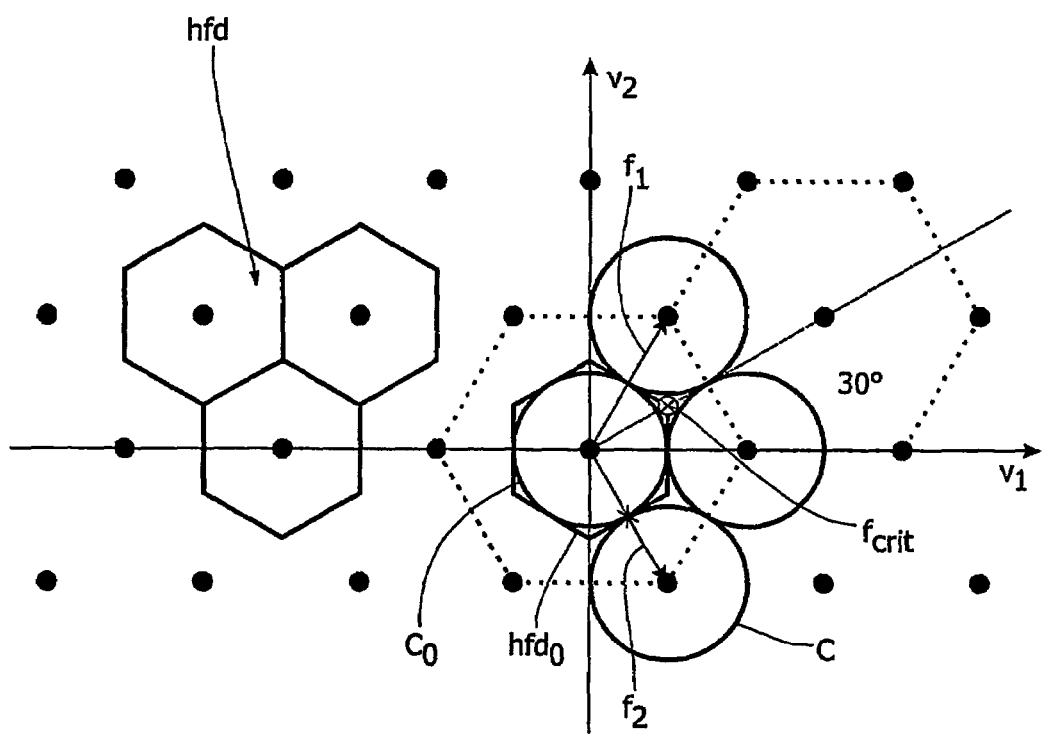
Figure 9:
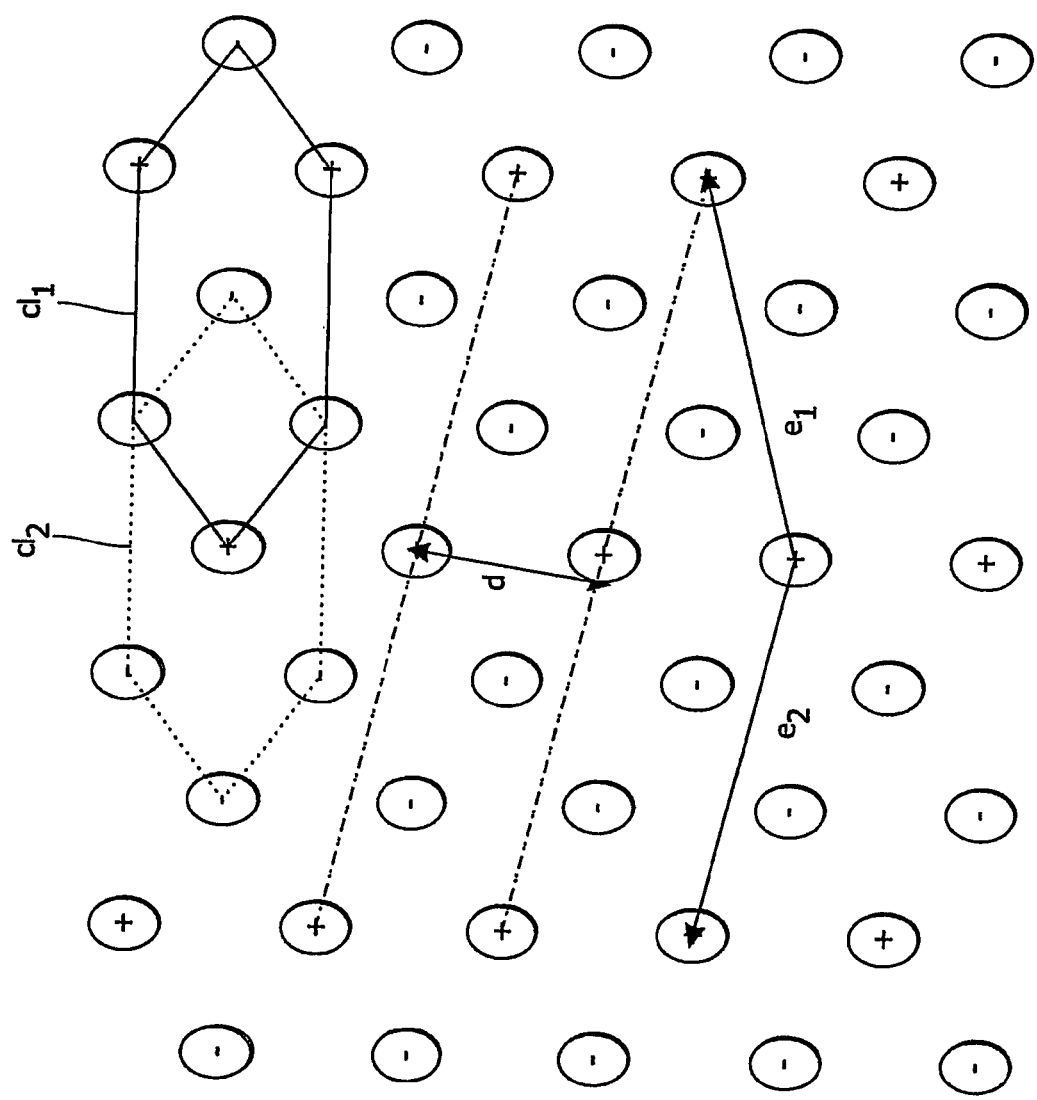
Figure 13:
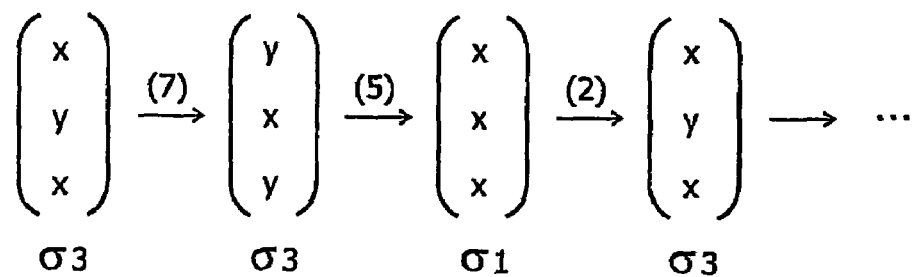
Figure 14A:
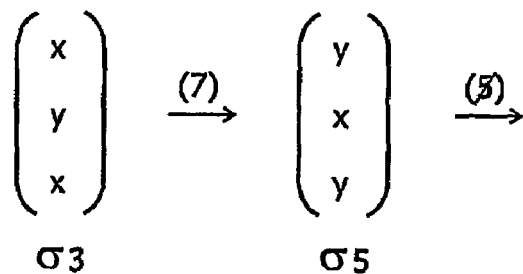
Figure 14B:
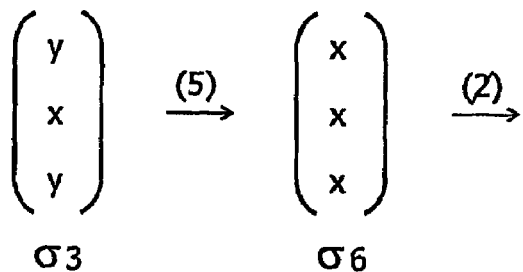
Figure 14C:
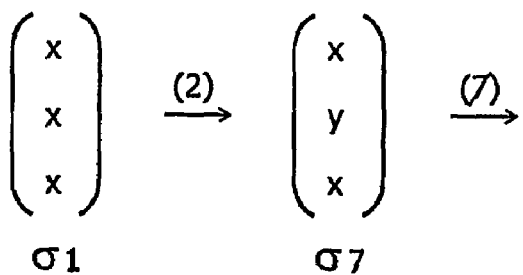
Figure 19:
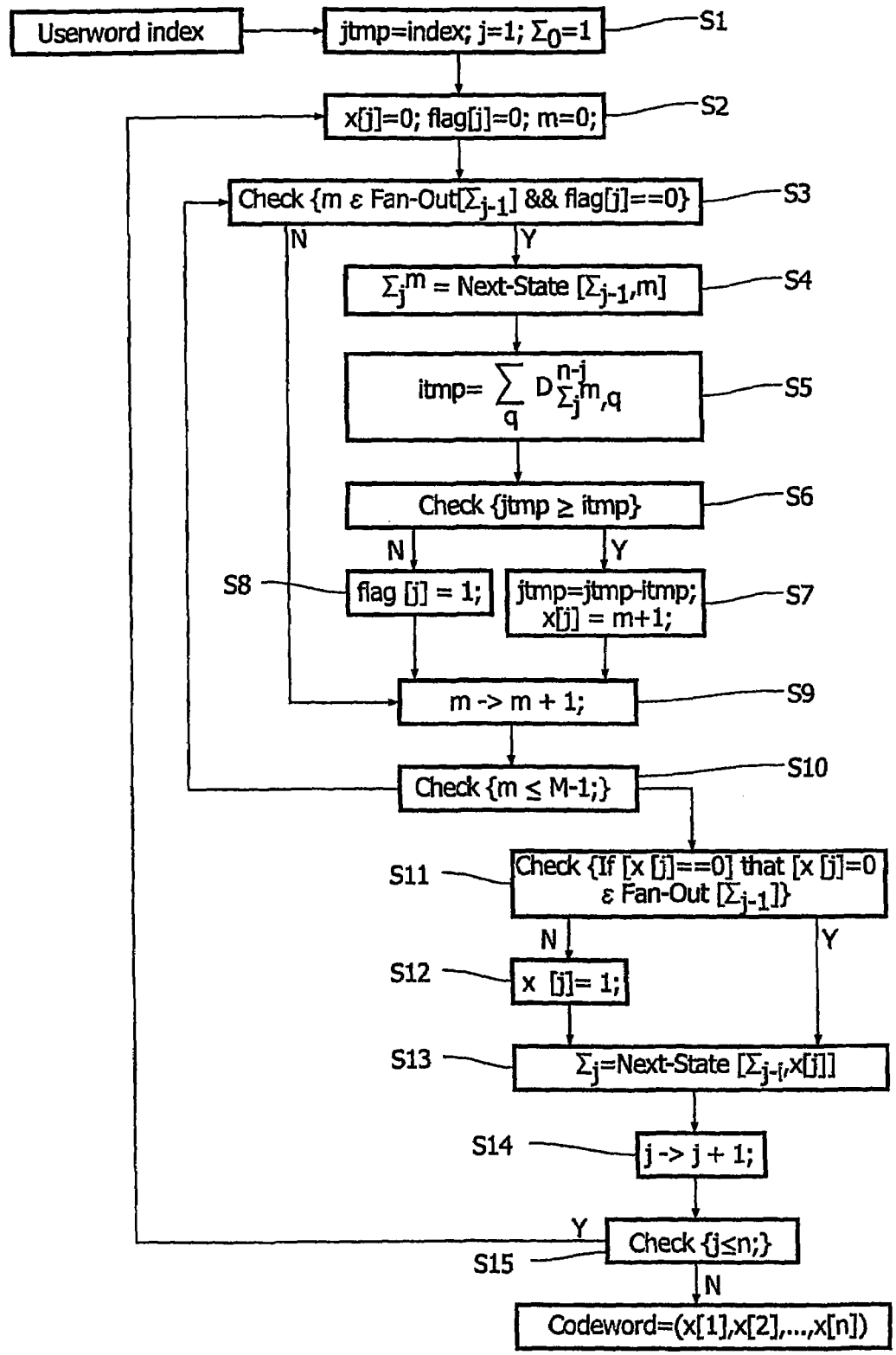
Figure 20:
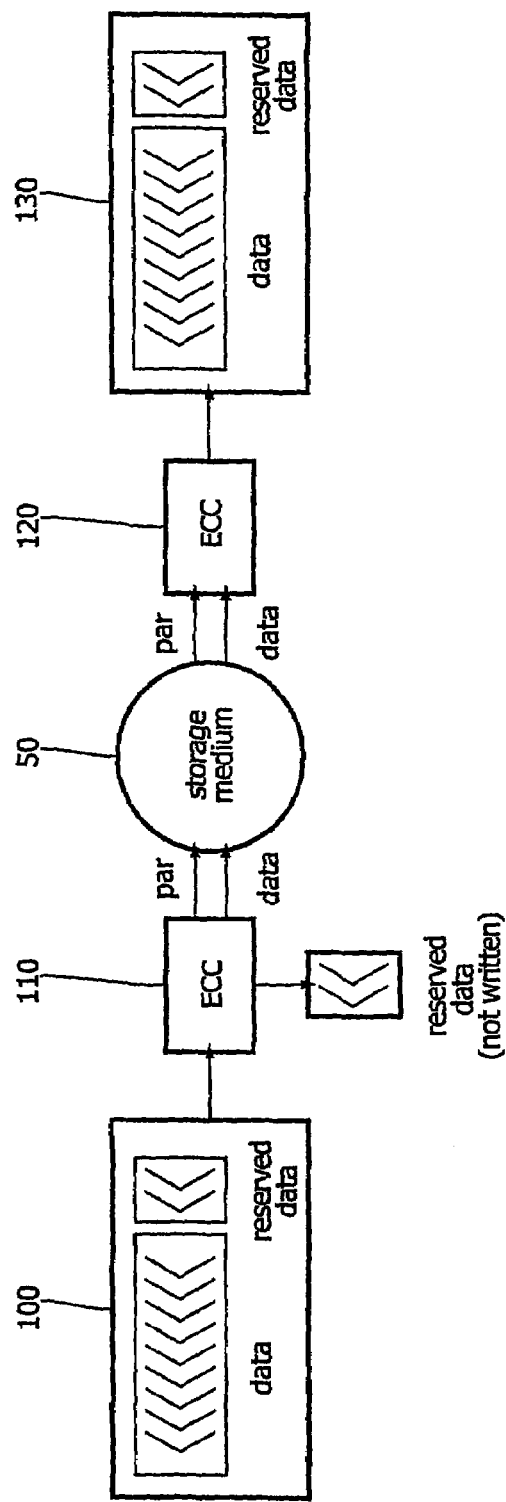
Figure 21:
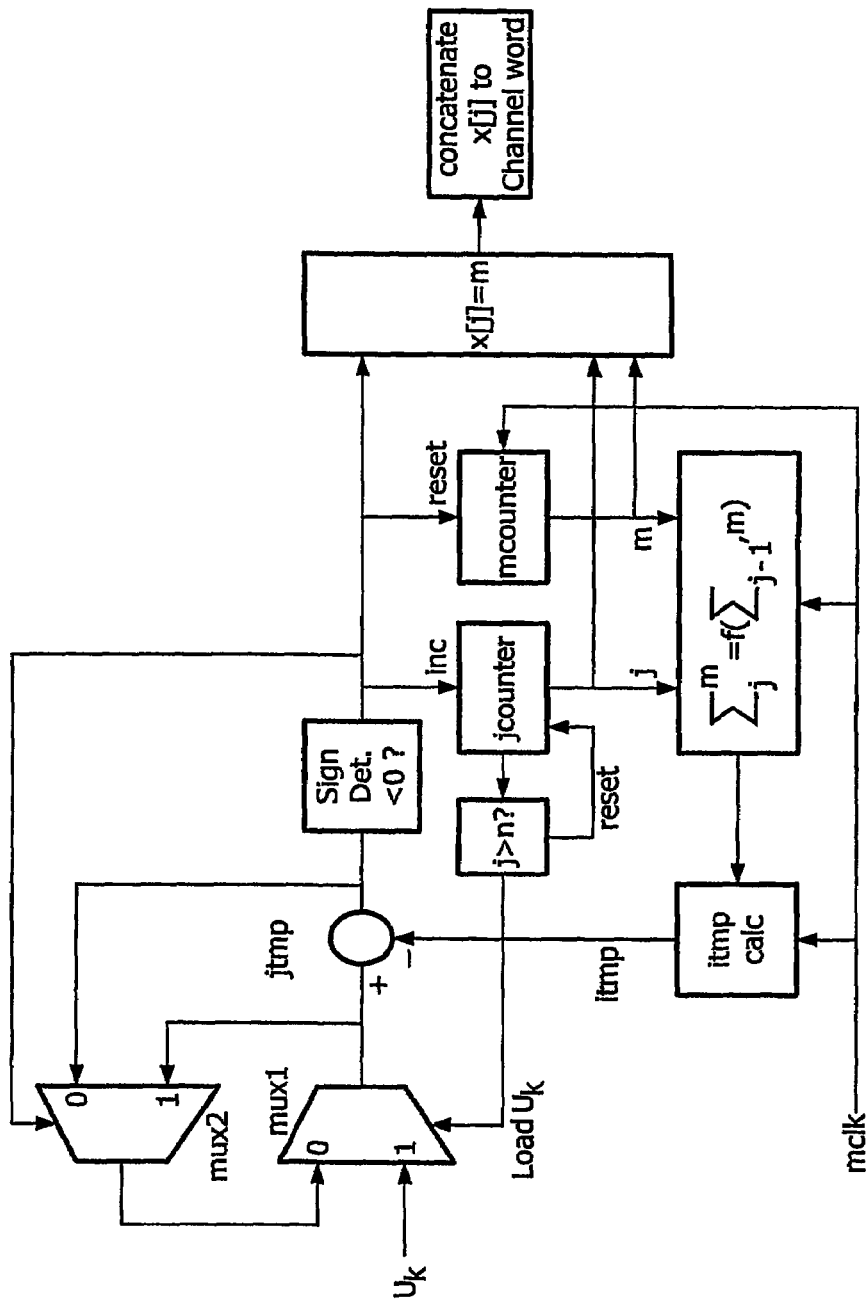
Figure 22:
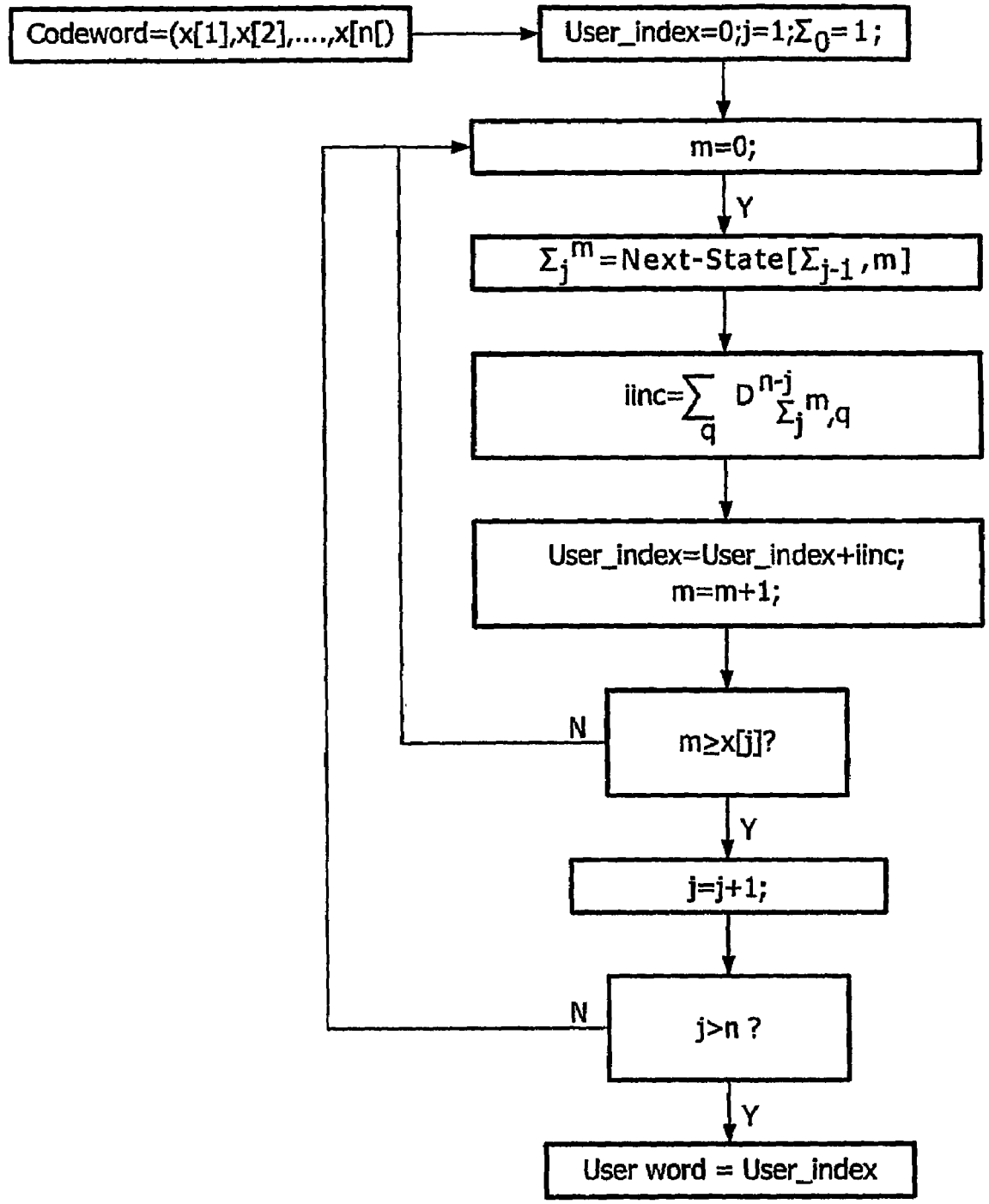
Figure 28:
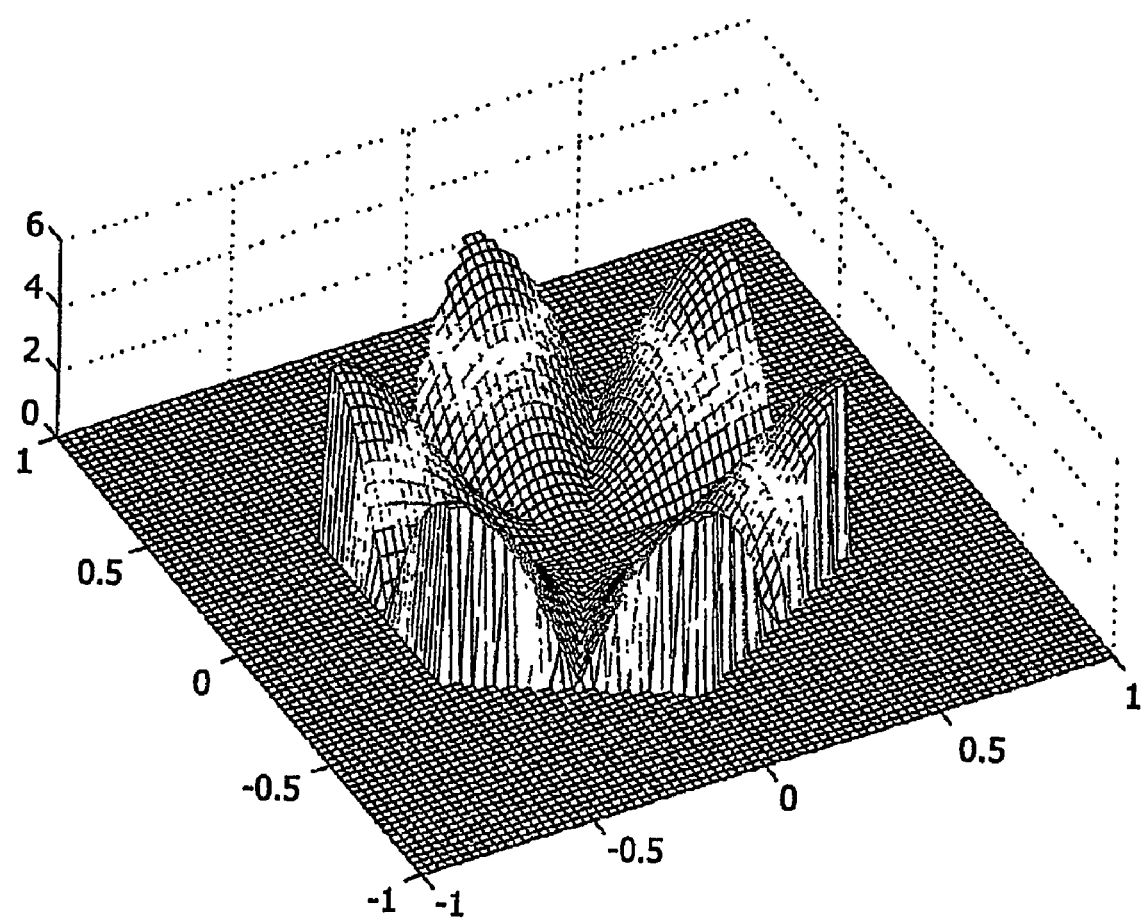
Figure 29:
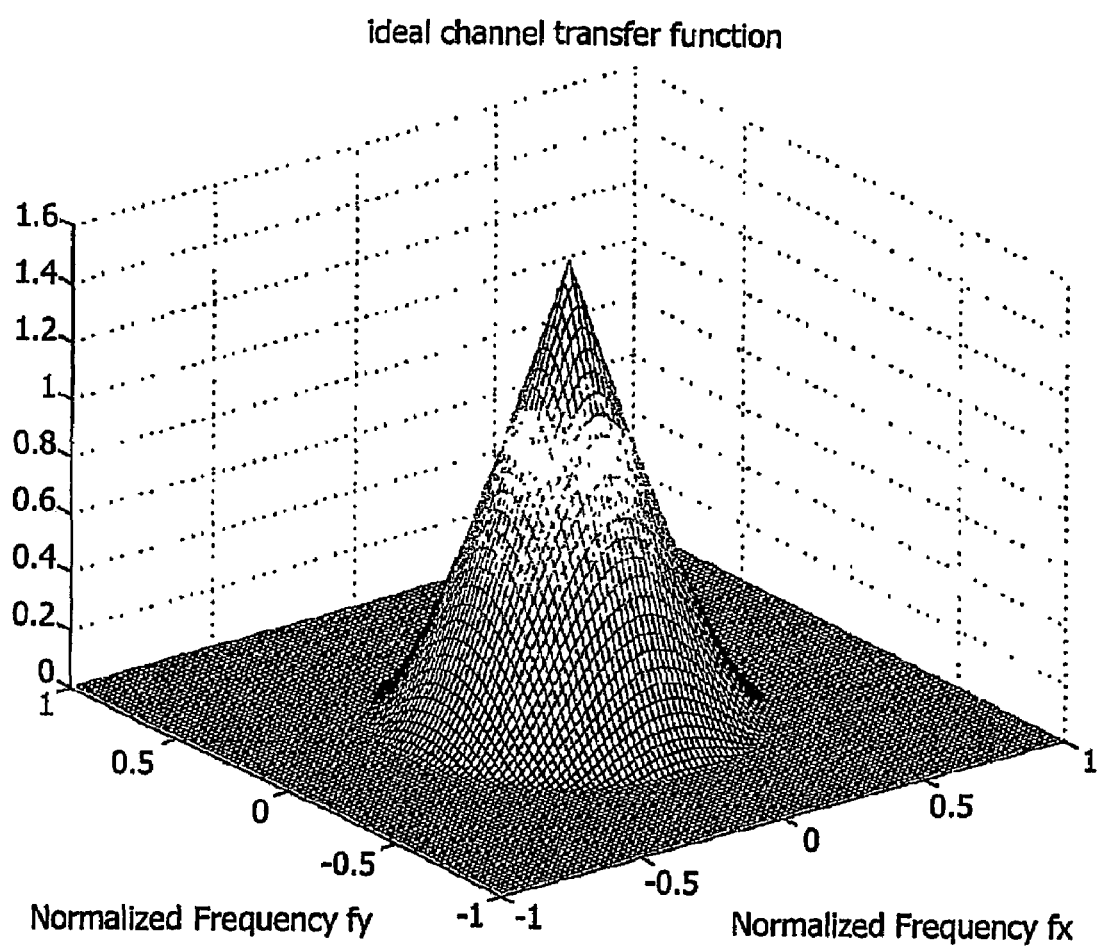

The invention will now be explained in more detail with reference to the drawings illustrating various embodiments of the invention. Therein, FIG. 1 shows a block diagram of the general layout of a coding system, FIG. 2 a schematic diagram indicating a strip-based two-dimensional coding scheme, FIG. 3a shows a schematic diagram of a 1D modulation transfer function, FIG. 3b shows a schematic diagram of a 2D modulation transfer function, FIG. 4 shows a linear model for hexagonal distributed bits, FIG. 5 shows a first embodiment of a worst case pattern, FIG. 6 shows a hexagonal (real-space) bit-lattice with its base vectors, FIG. 7 shows a reciprocal lattice with various shapes of possible fundamental domains, hexagonal fundamental domain (hfd) and rectangular fundamental domain (rfd), FIG. 8 shows a reciprocal lattice, a fundamental domain and MTF-circles representing the 2D cut-off frequencies of the channel, FIG. 9 shows another embodiment of a worst case pattern, FIG. 10 shows a table indicating four initial STD-states with NRZI channel bits, FIG. 11 shows the transition from a current to a next NRZI triplet, FIG. 12 shows a table listing some worst case patterns, FIG. 13 shows a particular example of a sequence of STD-states, FIGS. 14a-c shows transitions from a current to a next STD-state in response to different NRZ channel symbols, and the elimination of specified symbols in order to truncate the generation of a worst-case pattern, FIG. 15 shows a first embodiment of a state transition diagram according to the invention, FIG. 16 shows a connection matrix according to the invention, FIG. 17 shows a connection matrix according to another embodiment of the invention, FIG. 18 shows the procedure used during enumerative encoding, FIG. 19 shows a flow diagram for enumerative encoding, FIG. 20 shows a block diagram of the layout of the coding system in which the invention can be applied, FIG. 21 shows a block diagram of an encoding apparatus according to the invention, FIG. 22 shows a flow diagram followed during enumerative decoding, FIG. 23 shows another embodiment of worst case patterns according to the invention, FIG. 24 shows a first group of minimum weight patterns, FIG. 25 shows a second group of minimum weight patterns, FIG. 26 shows a third group of minimum weight patterns, FIG. 27 shows a worst case pattern (a) and its filtered version (b), FIG. 28 shows the spectral content of the worst case pattern shown in FIG. 27a and FIG. 29 shows an ideal 2d modulation transfer function.

FIG. 1 shows typical coding and signal processing elements of a data storage system. The cycle of user data from input DI to output DO can include interleaving 10, error-correction-code (ECC) and modulation encoding 20, 30, signal preprocessing 40, data storage on the recording medium 50, signal post-processing 60, binary detection 70, and decoding 80, 90 of the modulation code, and of the interleaved ECC. The ECC encoder 20 adds redundancy to the data in order to provide protection against errors from various noise sources. The ECC-encoded data are then passed on to a modulation encoder 30 which adapts the data to the channel, i.e. it manipulates the data into a form less likely to be corrupted by channel errors and more easily detected at the channel output. The modulated data are then input to a recording device, e.g. laser beam recording device or electron beam recording device, a spatial light modulator or the like, and stored in the recording medium 50. On the retrieving side, the reading device (e.g. photo-detector device or charge-coupled device (CCD)) returns pseudo-analog data values which must be transformed back into digital data (one bit per pixel for binary modulation schemes). The first step in this process is a post-processing step 60, called equalization, which attempts to undo distortions created in the recording process, still in the pseudo-analog domain. Then the array of pseudo-analog values is converted to an array of binary digital data via a bit-detector 70. The array of digital data is then passed first to the modulation decoder 80, which performs the inverse operation to modulation encoding, and then to an ECC decoder 90.

In the above mentioned European patent application EP 01203878.2 the 2D constrained coding on hexagonal lattices in terms of nearest-neighbour clusters of channel bits is described. Therein, the focus has been mainly on nearest-neighbour constraints with their advantages in terms of more robust transmission over the channel, but not on the actual construction of such 2D codes. The latter topic is addressed in the European patent application 02076665.5 (PHNL 020368), i.e. the implementation and construction of such a 2D code is described therein.

The present invention describes 2D channel coding with different coding constraints, the purpose of which is to prohibit certain classes of worst-case patterns. By way of example, a certain 2D hexagonal code shall be illustrated in the following. However, it should be noted that the general idea of the invention and all measures can be applied generally to any 2D code, in particular any 2D hexagonal or square lattice or quasi-closed-packed lattice code. Finally, the general idea can also be applied to multi-dimensional codes, possibly with isotropic constraints, characterized by a one-dimensional evolution of the code.

Figure 2:
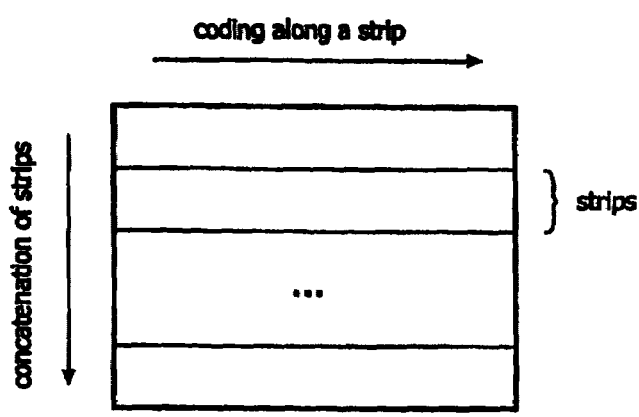

According to the present invention data is recorded on a two-dimensional lattice. This lattice is preferably hexagonal, but can also be orthogonal or have any other possible periodic repetition of bit positions. The data can be read out by scanning the two-dimensional lattice in a one-dimensional way using an array of laser spots, preferably with the scanning direction along the direction of the broad spiral. In a preferred embodiment of the present invention, the code evolves along the same one-dimensional direction as the scanning direction of the array of laser spots. A broad spiral of the 2D format may consist of several 2D strips. Channel code words use the full radial extent of a strip. A 2D strip consists of a number of 1D rows, stacked upon each other in a second direction orthogonal to the first direction. The principle of strip-based 2D coding is shown in FIG. 2. There can be strips of more than one row in the radial direction. Strips within a broad spiral are stacked one upon the other, possibly in an alternating fashion when there are two types of strips. Between the successive revolutions of the broad spiral, a guard band of, for instance, one row may be located. The optical channel resulting from the scanning of the data with each of the laser spots has the well-known low-pass behavior with a hard cut-off at $f_{sp}=2NA/\lambda$. The Modulation Transfer Function (MTF) can be written as:

$$MTF = \begin{cases} \frac{2}{\pi} \arccos\left(\frac{f_{sp}}{f_c}\right) - \frac{2}{\pi} \frac{f_{sp}}{f_c} \sqrt{1-\left(\frac{f_{sp}}{f_c}\right)^2} & f_{sp} \leq \frac{2NA}{\lambda}; \\ 0 & f_{sp} \leq \frac{2NA}{\lambda}. \end{cases}$$

In the one-dimensional case this modulation transfer function determines the amount of inter-symbol interference and the achievable linear density of the system along the track direction. In the radial direction the density is determined by the track-pitch. The value of the track-pitch is determined by optical cross-talk when reading the data or thermal cross-talk (cross-erase) when writing data on a phase-change medium. The modulation code is designed for data evolving in the direction along the track in such a way that the spectral content of the data is transmitted properly by the low-pass optical channel. Therefore, only the MTF as a one-dimensional function as shown in FIG. 3*a* is considered. For the two-dimensional case however, data evolves in all directions in the same way. The shape of the MTF is equally important in all directions when a 2D modulation code is designed. The MTF must be considered as a two-dimensional function as is shown in FIG. 3*b*. The radius of this 'chinese hat'-function is again $f_{sp}=2NA/\lambda$. The two-dimensional MTF can be seen as the auto-correlation function of a circular top-hat function with radius $NA/\lambda$.

In the following the hexagonal lattice will be exemplary considered because it is has a clear advantage in density over a square lattice. The packing fraction of the square lattice is 15% smaller than that of the 2D hexagonal lattice. Bits are distributed across this hexagonal lattice as pits with a diameter smaller than the hexagonal lattice constant This is needed to avoid folding of the signal. The HF signal can be calculated with a scalar diffraction model, but it is also possible to approximate it with reasonable accuracy with a linear model as is shown in FIG. 4 with a central tap-value equal to $c_0$ and with $c_1$ as tap-value for all 6 nearest-neighbour bits around the central bit.

At a first glance the most critical (highest) frequency on this lattice seems to be the periodic repetition of zeroes (−) and ones (+) as is indicated in FIG. 5. From the linear model a HF signal is obtained equal to:

$$HF = \pm(C_0 - 2c_1)$$

where the sign depends on the polarity of the cluster.

The HF signal is equal to zero if $c_0 = 2c_1$ for all bit positions of the critical pattern. This indicates that at the cut-off of the MTF the linear model fulfills this condition of $c_0 = 2c_1$. The hexagonal lattice parameter $a_H$ determines the distance between the planes of zeroes and ones for the critical pattern. It is equal to $d = \sqrt{3} a_H$. The frequency resulting from this period d has a cut-off at $2NA/\lambda$:

$$\frac{1}{d} = \frac{1}{\sqrt{3}a_H} = \frac{2NA}{\lambda} \Leftrightarrow a_H = \frac{1}{2\sqrt{3}} \frac{\lambda}{NA}$$

Inserting $\lambda=405$ nm and $NA=0.85$ leads to a lattice parameter of 137.5 nm. It can thus be expected that a scalar diffraction simulation with this lattice parameter leads to HF levels that reasonably fit the linear model for which $c_0=2c_1$. This appears to be true. The equivalent areal density is then 2.2 times the areal density achieved in BD (and 2.0 times the density of BD after inserting one so called guard-band for every 11 tracks in the broad spiral, each guard band has the width of one bit row).

A second check for the above calculation is derived from the calculation of reciprocal lattices. To do this the hexagonal lattice is described by two base vectors:

$$e_1 = \frac{a_H}{2}\begin{bmatrix} \sqrt{3} \\ 1 \end{bmatrix} \text{ and } e_2 = \frac{a_H}{2}\begin{bmatrix} \sqrt{3} \\ -1 \end{bmatrix}$$

This is shown schematically in FIG. 6. The equivalent of such a vector in the 1D case is a scalar that denotes the lattice constant (spatially) or the sampling period T (for time).

Now, a so-called generating matrix can be defined (for a given 2D periodic lattice, L, this generating matrix is not unique):

$$L = \begin{bmatrix} e1_x & e2_x \\ e1_y & e2_y \end{bmatrix} = \frac{a_H}{2}\begin{bmatrix} \sqrt{3} & \sqrt{3} \\ 1 & -1 \end{bmatrix}$$

The generating matrix of the reciprocal lattice is the inverse transposed of the generating matrix of the original lattice (the lattice upon which the bits are ordered; also known as real-space or direct-space lattice):

$$L* = L^{-t} = \frac{2}{a_H}\frac{1}{2\sqrt{3}}\begin{bmatrix} 1 & 1 \\ -\sqrt{3} & \sqrt{3} \end{bmatrix}$$

The reciprocal lattice is also a hexagonal lattice. It is rotated by $\pi/6$ with respect to the original lattice and it is scaled by a factor of $\frac{1}{2}\sqrt{3}$ as is schematically shown in FIG. 7 (it is to be noted that only the hexagonal shape of the lattice is rotated by $\pi/6$. The individual base vectors are rotated by $\pi/6$ and $-\pi/6$ respectively). The figure also shows some possible fundamental domains of the reciprocal lattice. A fundamental domain is an area that has the property that adjacent fundamental domains do not overlap and that the concatenation of fundamental domains of all the lattice points must fill the complete 2D space. The 2D Shannon sampling theorem now states that a function in the spatial domain can be retrieved from its sampled version if the Fourier Transform is contained within a fundamental domain of the reciprocal lattice. There is no unique fundamental domain as is indicated in FIG. 7, but preferably the hexagonal fundamental domain is chosen (it is no coincidence that such a hexagonal domain is the best fit to the circular shape of the 2D MTF, which supports the above argumentation in terms of packing fractions). It shall be noted further, that the rectangular fundamental domains in FIG. 7 show that for a hexagonal lattice a somewhat higher frequency can be allowed in one direction if the frequency in the orthogonal direction is known to be limited to a somewhat lower value.

The distance between points on the reciprocal lattice is $2/\sqrt{3}a_H$. This means that if touching circles around each lattice point can be drawn they have a radius of $1/\sqrt{3}a_H$. The 1D equivalent of this radius can be treated as a sort of cut-off frequency of the channel. The circles can be seen as the base-plane of the MTF that is shown in FIG. 3$b$. The radius of such a circle must be equal to $2NA/\lambda$. This means that it can be written:

$$\frac{1}{\sqrt{3}a_H} = \frac{2NA}{\lambda} \Leftrightarrow a_H = \frac{1}{2\sqrt{3}} \frac{\lambda}{NA}$$

The fact that this value is equal to the value that was already derived above verifies the reasoning. Besides the lattice itself it is also possible to define generation matrices of periodic patterns on this lattice (these are know as super-structures in crystallography). The critical pattern discussed above for example can be written as:

$$L_{crit} = \frac{a_H}{2}\begin{bmatrix} \sqrt{3} & \sqrt{3} \\ 1 & -3 \end{bmatrix}$$

The corresponding reciprocal lattice is:

$$L_{crit}^{-t} = \frac{2}{a_H}\frac{1}{4\sqrt{3}}\begin{bmatrix} 3 & 1 \\ \sqrt{3} & -\sqrt{3} \end{bmatrix}$$

The vectors of this lattice are drawn in the reciprocal lattice. This is shown in FIG. 8. Furthermore, the circles as discussed above are drawn. It now appears that indeed one of the reciprocal vectors of the critical pattern lies exactly on the circle (i.e. exactly on the cut-off of the MTF). This is indicated with a small cross (in the direction of $f_2$).

In the above touching circles in the frequency domain have been drawn that can be seen as the base of the MTF. These circles were treated as the equivalence of the cut-off frequency. It appears that the frequency space cannot be fully covered by drawing touching circles. This means that there might be frequency components in the signal that are not transmitted by the modulation transfer function at the combination of chosen density and optical parameters. When investigating this problem it indeed appears that there are bit patterns that have most or all of their energy in the area between the circles. The most prominent example is the one indicated in FIG. 9. The base vectors of the lattice are also shown in FIG. 9. It has reciprocal vectors on the corners of the hexagonal fundamental domain of the reciprocal lattice indicated with a circled cross in FIG. 9.

The HF-samples from this pattern are equal to $c_0-6c_1$ or $-c_0$. This means that the HF-samples do not show any modulation when going from one bit of the critical pattern to the other when:

$$c_0-6c_1=-c_0 \Leftrightarrow c_0=3c_1$$

This shows that the channel is already 'dead' for lower densities than the one initially expected. This also means that if the worst-case pattern occurs for a longer time the PLL of the encoder might fall out of lock or shows severe phase deviation.

One solution to the problem is to lower the density in such a way that the circles overlap and cover the complete frequency space. However, this will cost quite some density. The increase in radius of the circle must be a factor $1/\cos(30°)=2/\sqrt{3}$ as is clear from FIG. 8. The density ratio is simply calculated as $(2/\sqrt{3})^2=4/3$. This means that the achievable density is only 75% of the initially assumed density i.e. 0.75*2.2=1.65 times the density of BD. This is, however, not yet a sufficient density.

A second, more desirable possibility is to exclude patterns from the data that have frequency components in the non-covered region. This can be done by applying a suitable modulation code. A known modulation code is described in European patent application 02076665.5 (PHNL 020368). Therein a 2D modulation code is proposed that evolves in one dimension along a strip consisting of $N_{rows}$ rows (a so-called fish bone code). Each of the channel words consist of a sequence of M-ary ($M=2^{Nrow}$) NRZ channel symbols that indicate the type of transition between the successive NRZI bits that are finally recorded on the medium. This modulation code was described by considering the practical case of 3 rows in a 2D strip. For simplicity it will also be adhered here to this assumption although the present invention is generic for any number of rows larger than 3. The concept of isolated bits that was introduced in the above mentioned European patent application is not needed, and therefore only 4 states are required in the initial state transition diagram (STD). These states are listed in FIG. 10.

Since it is not necessary to distinguish between the different polarities of a (worst-case) pattern the states are denoted with x and y indicating opposite binary symbols (i.e. when x is defined as 0 or 1, y is defined as 1 or 0 respectively). The reason that the exact polarity must not necessarily be considered is that the output data, which are preferably recorded on a disc, is of the bipolar NRZI type which is generated from the NRZ data by using a 1-T precoder (integrator modulo 2). In the present case the 1-T precoder operates in a 1-dimensional way along the direction of the spiral. As already mentioned, a state transition can be described by a channel symbol, in the present case consisting of a bit-triplet where each of the NRZ bits indicate a transition (1) or the absence of a transition (0) in the bipolar NRZI channel bit-stream. This is shown in FIG. 11.

Now it is possible to write down the sequence of NRZ channel symbols that will generate the worst-case-pattern that was shown in FIG. 9. It must be noted that there are other worst-case-patterns. Some of them are listed (not exhaustively) in the table shown in FIG. 12.

Long patterns can be formed by repeating these basic building blocks. They will not show modulation for the central row for a particular choice for the ratio $c_0/c_1$. When started in state $\sigma_3$ the sequence for the pattern of FIG. 9 is as shown in FIG. 13.

It should be noted that the last state is equal to the first state and the sequence can be repeated to form a longer worst-case pattern. It is desired to eliminate the sequence of NRZ symbols that lead to the worst-case pattern by truncating this sequence as soon as a possible build up of the pattern is detected. In the following example the sequence is already truncated after two consecutive NRZI triplets that are part of the worst-case pattern (of course also longer sequences might be allowed depending on the robustness of the bit-detection for this pattern and the allowed burst-like behaviour of random errors in the system). The truncation can be done by defining 'colored' states that have the same NRZI triplet but do not have a fan-out of a symbol that will lead to the next triplet of the worst-case pattern. This is shown schematically in FIGS. 14*a* to 14*c* for different initial states.

In the above cases $\sigma_5$ is a version of $\sigma_3$ without fan-out for the NRZ symbol (5). In the same way $\sigma_6$ is a version of $\sigma_1$ without symbol (2) and $\sigma_7$ is a version of $\sigma_3$ without symbol (7). This means that the state transition diagram (STD) now looks as shown in FIG. 15. The corresponding connection matrix is shown in FIG. 16.

The largest eigenvalue, $\lambda_{max}$ of this connection matrix is equal to 7.91697. This means that the capacity of this code is equal to:

$$C = \frac{1}{3} \log_{2(\lambda max)} = 0.994983$$

The factor 1/3 is needed because each state corresponds to a channel symbol that consist of 3 bits. It can be seen that the code rate is nearly equal to 1. This is not surprising because the occurrence of the worst-case pattern was not expected very frequently. As already mentioned above an additional problem of the worst-case pattern is that the modulation is zero and the PLL or delay synchronization block (for the alignment of the signal waveforms obtained from the array of laser-spots that is inclined with respect to the direction of the broad spiral) might experience problems. Other causes for problems in the PLL or delay synchronization block are a long number of consecutive zeroes or ones. In view of robust timing recovery, it is beneficial to include a k-constraint. A k-constraint can be applied in both tangential $K_t$ and radial direction $K_r$. To introduce a tangential k-constraint the maximum number of consecutive symbols (0) that occur between non-zero symbols can be limited to $K_t$. For example when $K_t=1$ the encoder is allowed to emit a single symbol (0). Then it will be arrived in an extra state $\sigma_1'$. From this state it is not allowed to emit a symbol (0). Such a construction means that the number of states in the state transition diagram doubles. This results in the connection matrix shown in FIG. 17. The same procedure can be applied for $K_t$ constraints larger than 1.

It can be seen that on the main diagonal of the states $\sigma_1$ to $\sigma_4$ the value is reduced by 1 in comparison to above connection matrix shown in FIG. 16. This is caused by the fact that emitting a symbol (0) in these states will not lead to the same state, but will lead to an extra state $\sigma_1'$ to $\sigma_4'$. This causes $I_4$ (the 4×4 identity matrix) in this part of the connection matrix. When a symbol (0) is emitted in the states $\sigma_5$ to $\sigma_7$ this will automatically stop the generation of a worst-case pattern. As a result, the next state will be one out of $\sigma_1'$ to $\sigma_4'$. As an example, when symbol (0) is emitted in $\sigma_5$ the next state will not be $\sigma_5'$ but $\sigma_3'$. When being in the states $\sigma_1'$ to $\sigma_7'$ any symbol can be emitted again except the symbol (0). Therefore, this part of the matrix is a copy of the upper left corner of the same matrix and the rest is filled up with zeroes. For $K_t=2$ another 7 states can be added and the same procedure can be followed. These are the code constraints for which the practical code construction is described in the following description.

The radial constraint $K_r$ might be violated in state $\sigma_1$ because here all bits of the triplet are equal. A transition to a subsequent state $\sigma_1$ can be via a symbol (0) or a symbol (7). The symbol (0) was already excluded by the introduction of a tangential constraint $K_t$. Therefore implementing the constraint $K_r$ can simply be done by introducing an additional state that is equal to $\sigma_1$ but has no fan-out for the symbol (7). The radial k-constraint might become of more importance when also re-sampling of the data in the radial direction (in case of sloppy radial tracking) is considered.

Because the capacity of the channel constraints with $K_t=2$ is nearly equal to 1, in a preferred embodiment a 152→153 code mapping is chosen. This results in 51 fishbones of 3 bits. 1 fishbone is added for DC-control on one of the bit-rows in the strip of 3 bit-rows (comparable to BD where 1 DC-control bit is added every 45 source bits). The 152 source bits lead to 152/8=19 bytes. When the code is implemented that eliminates the worst-case patterns it appears that indeed the worst-case patterns do not occur within the chosen strip of 3 rows. However, concatenation of the strip might again lead to the worst-case pattern (e.g. when strip A and B are concatenated a worst-case pattern is still possible in a 3-row strip that is build up from the bottom row of strip A and the two top rows of strip B). Therefore, a separation track (which can also be considered as a strip of one bit row wide) is preferably inserted in between the strips that are 3 bit-row wide. The code for this separation track has a k-constraint and eliminates both the '1001001001 . . . ' and '0110110110 . . . ' sequences (NRZI) that might lead to the worst case pattern. This can be done by applying a 12→13 code (the code construction is not discussed here, but the well-known ACH procedure with state-splitting and state-merging can be followed). 4*13 perfectly fits the number of fishbones (51+1) and perfectly fits a byte oriented approach: Each user word of 12 bits is 1.5 bytes and 4*1.5=6 bytes. So this example has a total of 69 (3*19+2*6) bytes encoded in one block with 11 rows. Another number of rows (equal to 4n+3 with n an integer number) is also possible with the same format, but it has to be taken into account that in the present proposal the central row has to be DC-free for servo purposes (and the 12→13 code is not DC-free): this means the current 12->13 code is applicable for the cases where n is even (3, 11, 19, . . . bit-rows).

The implementation of the 152-→153 code normally leads to unpractically large look-up tables (or code-books). A possible way to circumvent this problem is the application of enumerative coding as described in T. M. Cover "Enumerative Source Coding", IEEE Trans. Inf. Theory, Vol IT-19, No. 1, January 1973. Each possible codeword is given an index according to its position in the lexicographic ordering (with lexicographic ordering it is simply meant that for example in the decimal system a 4 has higher order than 0, 1, 2 and 3 and in the binary system a 1 has higher order than 0 or in other notation: 0<1). For a binary sequence the index can be calculated as:

$$i_s(x) = \sum_{j=1}^{n} x_j n_s(x_1, x_2, \ldots, x_{j-1}, 0)$$

where $n_s(x_1, x_2, \ldots, x_k)$ is the number of sequences for which the first k coordinates are given by $(x_1, x_2, \ldots, x_k)$. The example shown in FIG. 18 illustrates the procedure. In the code implementation for the current invention, binary sequences are not obtained, but sequences of M-ary symbols (in the present embodiment $M=2^{Nrows}=8$). The symbol is an element of $\{0, 1, 2, 3, \ldots, M-1\}$. The lexicographic index can now be written as:

$$i_s(x) = \sum_{j=1}^{n} \sum_{m=0}^{x_j-1} n_s(x_1, x_2, \ldots, x_{j-1}, m).$$

The sequence of M-ary symbols can be considered as the channel data and the lexicographic index of each of the symbols in the sequence is the equivalent modulation decoded sequence. Code tables are not required.

For the encoding the inverse procedure can be used. It is started with data that indicate the lexicographic index. It shall be assumed that the lexicographic index $i_S(x)=i$ is given. The following steps must be followed for the binary case (i.e. the inverse of the above equation for $i_S(x)$):

Step1: Set x to zero;
Step2: If $i > n_S(0)$ set $x_1=1$ and set $i=i-n_S(0)$;
Step3: For $k=2, \ldots, n$, if $i > n_S(x_1, x_2, \ldots, x_{k-1}, 0)$ set $x_k=1$ and set $i=i-n_S(x_1, x_2, \ldots, x_{k-1}, 0)$.

Following this procedure will result in the encoding (in case of binary data). A similar encoding procedure can be followed for M-ary data in the 2D case. Also here no large code tables are needed. According to the above last equation for $i_S(x)$, only the set of numbers denoted by $n_S(x_1, x_2, \ldots, x_{j-1}, m)$ is needed. In the d-constrained 1D RLL binary coding, this set of numbers reduces to $x_j N_d(n-j)$ (with $x_j$ the binary bit value, with n the channel-word length, and with $N_d(p)$ the number of d-constrained sequences of length p). A similar reduction cannot be made for the current case of the 2D coding in a strip of 3 bit-rows aligned on an hexagonal lattice of bits.

Supposing that encoding is started from state $\Sigma_0$ always being equal to $\sigma_1$ of the state-transition diagram (the state at moment j is indicated with $\Sigma_j$; this state is equal to one of the states in the state transition diagram, i.e. $\Sigma_j \in \{\sigma_1, \sigma_2, \ldots, \sigma_n\}$). What is actually needed is to take into account at symbol position j for emission of symbol m is the resulting state, hereby considering the history of the previously emitted channel symbols $x_1, x_2, \ldots, x_{j-1}$ which represent a path through the state-transition diagram. This is shown schematically below, with the resulting state denoted by $\Sigma_j^m$:

$$\sum 0 \xrightarrow{x[1]} \sum 1 \xrightarrow{x[2]} \sum 2 \xrightarrow{x[3]} \sum 3 \ldots \xrightarrow{x[j-1]} \sum j-1 \xrightarrow{m} \sum_j^m.$$

It is thus obtained $$n_s(x_1, x_2 \ldots, x_{j-1}, m) = n_s'(\Sigma_j^m),$$

where $n'_S(\Sigma_j^m)$ indicates the total fan-out from state $\Sigma_j^m$ up to any possible state q after completion of the channel word (with emission of n−j extra symbols until the end). Therefore, it is obtained that $$n'_s\left(\sum_j^m\right) = \sum_q D_{\Sigma_j^m, q}^{n-j}$$

where D is the connection matrix of the state-transition diagram, the required power is n−j (the remaining number of symbols to be emitted), the required matrix element is $(\Sigma_j^m, q)$ and the sum is over all possible states q.

The algorithm for enumerative encoding is shown in more detail in FIG. 19. With the user-word is associated a unique index. The user-word is mapped onto a channel word consisting of n fish-bones. With each fish-bone corresponds an M-ary channel symbol (with $M=2^{Nrow}$). For the practical case that is considered here, it is obtained that $N_{row}=3$, and M=8. The M-ary channel symbols (j=1, 2, . . . , n) for the successive fish-bones in the channel-word are computed one by one. In the very first step (S1), the initial state $\Sigma_0$ (prior to the first symbol to be generated) is set to the first state $\sigma 1$ of the state-transition-diagram.

Then, a loop is started for all possible symbols m, starting from 0 (S2). With each symbol x[j] is also associated a flag denoted by flag[j], which is initially set to zero at the start of the m-loop. Next (S3), it is checked whether candidate symbol m for symbol position j can be emitted from state $\Sigma_{j-1}$, and whether the flag of the current symbol position is not yet raised to "1". If this is true ("Y"), then a temporary parameter "itmp" is computed (S4) which is the number of possible channel sequences that start with symbol m at position j. For that purpose, first the next-state is computed which results from emission of candidate symbol m at position j: this state is referred to as $\Sigma_j^m$. The number of remaining symbols to be emitted in order to reach the end of the channel word equals n−j, and the total fan-out from state $\Sigma_j^m$ to any possible state q at the end of the channel word is computed as a sum over q of matrix-element $(\Sigma_j^m, q)$ of the (n−j)-th power of the connection matrix D (S5). This fan-out depends on three parameters: (i) the state to start from, thus taking into account the history of the previous symbols; (ii) the position j of the channel symbol under investigation; and (iii) the candidate symbol m that is considered as channel symbol for position j. If the index (or what is left of it after previous iterations, denoted as "jtmp") is larger than the parameter "itmp" (S6), then "jtmp" is decreased by "itmp" (S7), and the symbol at position j is (at least) equal to m+1; in the other case ("jtmp" being smaller than "itmp") the flag for the current position j is raised to "1" (S8), which implies that no further action is done on this position for larger values of m.

After completion of the m-loop (S9), it is checked whether the resulting symbol x[j] equals "0" (S10), and in such case, whether this is allowed from state $\Sigma_{j-1}$ in view of the $K_t$ constraint (S11); if not, then the symbol is raised by one, thus x[j]=1 (S12). This yields the final decision for x[j]. Then the finally resulting next-state $\Sigma_j$ is computed (S13). Next the position "j" is increased by one (S14), and if not yet the end of the channel word has been reached ("Y", thus j≦n) (S15), then it is going back to start with the m-loop for the new current position j. In case j=n+1 ("N"), the end of the channel word has been reached, and all channel symbols have been determined (denoted by (x[1], x[2], . . . , x[n])). This completes the encoding procedure.

Another possible implementation for the elimination of worst-case patterns is the use of 'forbidden' sites. With forbidden sites those bit positions are meant that will lead in combination with previous data bits to a worst case pattern when they are occupied with a particular bit-value, independent of the actual bit-value that was planned to be written at that location. These forbidden bit-positions are just filled with a bit-value that prohibits formation of the worst-case pattern, and the next bit-position in the 2D channel stream is considered for writing the next bit. Due to the need to skip some forbidden bit-positions, there is a certain expansion area needed to accommodate storage space for the skipped positions. Similar to forbidding the fan-out of a particular symbol a bit-position is marked as 'forbidden'. Because it is not possible to store data on these sites, the capacity of the channel would become of a stochastic nature, depending on the number of worst-case patterns that occur. This can be solved by adding a small part for reserved data, which is the expansion area. The procedure is now as follows: NRZI bits are written in a sequential way through the (for instance 3-row) strip; when a certain bit-position would lead to a worst-case pattern for 0 or 1, it is written with the bit-value that does not generate the worst case pattern. The data that can not be stored because of these forbidden sites is added in the reserved data block. When no forbidden sites are used at all, the reserved expansion area is filled with zeroes. The size of the reserved data block equals the maximum number of forbidden bits. The data (including bits in the reserved part) is used as input to the error correction block. Parities are calculated that also contain information about the bits in the reserved block. The data (without the reserved block) and parities are now transmitted across the channel. At the receiver side the data are not available that was in the reserved part. These data can be restored by setting it initially to zero and using the ECC at cost of efficiency of the ECC (2 parity symbols for each 'missing' byte of reserved data). In the (very) rare case that the ECC is not able to correct a block and to retrieve the reserved data because it needs too many parities for the reserved block and to correct random errors, the ECC processing can be repeated by setting erasures (which requires 1 parity for each 'missing' byte) in the reserved block instead of zeroes (which will cost 2 parities for each 'missing' byte). The complete procedure is schematically shown in FIG. 20.

A more detailed block diagram of an encoding apparatus is shown in FIG. 21. The whole system runs on a clock mclk. First a user word (user index) $U_k$ is loaded and the counters j and m are reset to one and zero respectively. The initial state $\Sigma_0$ is reset to 1. Based on this initial state and a first value of m a next state is calculated $\Sigma_j^m$. Based on this state a value itmp is calculated (see the flow diagram in FIG. 19) in the icalc block. This value itmp is subtracted from the value jtmp (which is initially equal to $U_k$). The result (jtmp−itmp) is checked if it is negative or not. If not a next value of m is evaluated (triggered by mclk). This again gives a new value of itmp. This is again subtracted from jtmp (jtmp is now the updated value equal to jtmp−itmp of the previous iteration). If now the sign of (jtmp−itmp) is smaller than zero the value of jtmp is taken via mux 2 as the input to mux1 to prevent that itmp is subtracted from jtmp. In fact, jtmp-itmp was only used as an intermediate value to check the sign. Now the output of the Sign determination block is 1 and the following will happen:
1. x[j] is set to m. This is one symbol of the channel word.
2. Mcounter is reset to zero for the determination of the next channel symbol x[j+1].
3. Jcounter is incremented for determination of the next channel symbol x[j+1].

As soon as the jcounter is larger than n a new user word is loaded and the jcounter is reset. The final result (a series of x[j] values for j=1 to n) is the output in the form of the channel word. It should be noted that this block diagram does not include the k-constraints for a limited number of zero symbols.

A flowchart of a decoding method is shown in FIG. 22. The userword given by the user index is first set to zero (S20). Then the channel word (code word) is taken as an input. The first symbol of the codeword is taken (j=1) and an index m is iterated from 0 to x[j] (S21). Each time for a new value of m the next state is calculated (S22) and from this state the total number of possible sequences that start with symbol m at position j are calculated (S23). The user index is incremented with this number (S24) and then the index m is incremented by 1 (S25) until it reaches a value larger than x[j]. At that moment (S26) the next symbol from the channel word is taken (j=j+1). If it was the last channel word (S27) then the calculated index is the final user word.

Above different worst case patterns for the 2D optical channel have been described. A worst case pattern is a pattern that has a high probability to be detected erroneously when transmitted across the channel. For example when a=1 is transmitted and a'=−1 is received the error is −2. In the following the error sequence is divided by 2 to obtain a more compact notation: e=(a−a')/2. Further, a more detailed overview and a catalog of these patterns shall be given. For the time being two different types of worst case patterns shall be distinguished:

Type-I: Error patterns that have frequency components beyond the cut-off of the 2D-MTF. These patterns have been described above in detail.

Type-II: Minimum weight error patterns.

It shall be noted that the definitions are not orthogonal (e.g. the minimum weight error patterns have their main spectral content at high frequencies and even part of it outside the 2D-MTF). The classification is based on the way the patterns were found.

Type-II error patterns are characterized by the fact that the Euclidean weight of the transmitted error pattern across the channel is small:

$$d^2(e) = \sum_{k=-\infty}^{\infty} (e*g)_k^2$$

where g is the channel response. These kind of patterns have a high loss with respect to the matched filter bound. When a brute force search is done it has been found that all worst case patterns have the form of a closed ring of alternated +1 and −1 error symbols. A graphical representation is given in FIG. 23. The stars indicate a don't care symbol. At the boundaries the ring might be open at the side of the boundary. A catalog of these type of patterns is shown in FIGS. 24 to 26.

To eliminate the possible occurrence of these kinds of error patterns in the channel bitstream the states that are the result of these error patterns and/or the states that allow these error patterns to occur must be eliminated. Code constraints are needed in such a way that an occurrence of these types of errors in an admitted data sequence (i.e. one that does not violate the coding constraints) leads to a violation in the coding constraints. When it is looked carefully at the pattern it is found that the only patterns that allows the error patterns of FIG. 23 are the inverted form of the patterns itself. Therefore, it is sufficient to eliminate all sequences that form a closed ring of alternated +1 and −1 symbols from the data pattern. Fortunately, for the worst case one indicated in the upper left corner of FIG. 23 this is automatically done with the code that was described above. For larger rings (that have a smaller loss with respect to the matched filter bound) this is not the case. The fact that these patterns have such a high loss with respect to the matched filter bound also becomes clear from the hexagonal Fourier transform of these patterns. The example of FIG. 27 results in the spectrum of FIG. 28.

Looking at this spectrum and comparing it to the transfer function of the channel that is given in FIG. 29 it can be immediately seen that most of the spectral content of the pattern is in a range where the transfer of the channel is only small. A considerable part of the spectral content is even beyond the cut-off of the optical channel.

In conclusion 2 types of patterns can be distinguished that must be eliminated from the data sequence (based on the way the patterns were found). These can be defined as follows:

local periodic patterns (superstructures) that upon 2D Fourier transformation of the lattice formed by the pattern result in a lattice in the Fourier space with points beyond the cut-off of the modulation transfer function of the optical channel.

patterns that form a closed ring of alternated +1 and −1 symbols or part of a ring at the boundary of a stripe, where the opening of the ring is at the side of the boundary of the broad spiral.

The invention claimed is:

1. An encoding apparatus for two-dimensionally encoding user data of a user data stream into channel data of a channel data stream along a two-dimensional channel strip of at least two bit rows one-dimensionally evolving along a first direction and being aligned with each other along a second direction, said two directions constituting a two-dimensional lattice of bit positions, said apparatus comprising
a modulation code encoder for modulation code encoding said user data into said channel data according to a two-dimensional modulation code being adapted to prevent predetermined worst case patterns of channel data in said channel data stream.

2. An encoding apparatus claimed as in claim 1,
wherein said worst case pattern include local periodic patterns having fundamental frequency components outside the circle formed by the base of the two-dimensional optical modulation transfer function.

3. An encoding apparatus claimed as in claim 1,
wherein said worst case patterns include patterns forming a closed ring of bit symbols having alternating bit values or form an open ring of bit symbols having alternating bit values at a boundary of said channel data stream where the opening of the ring is at the side of the boundary.

4. An encoding apparatus as claimed in claim 1,
wherein said modulation code encoder comprises a state-transition machine for prevention of said worst case patterns by checking the building up of a worst case pattern during modulation code encoding and by truncating a sequence of channel words building up the start of a worst case pattern by entering a state of the encoding apparatus and its state-transition machine that forbids the emission of a NRZ channel symbol that leads to a further continuation of the worst case pattern.

5. An encoding apparatus as claimed in claim 4,
wherein said state-transition machine comprises a state conversion unit for putting said finite-state-machine into a new state generated depending on said NRZ channel symbol and the current state of said state-transition machine together with encoding a user word into a channel word, said generation method being based on an extended state-transition diagram having a number of STD-states comprising at least one pair of STD-states having an identical fan-out except for NRZI channel symbols that lead to a next NRZ channel symbol of a worst case pattern.

6. An encoding apparatus as claimed in claim 1,
wherein said modulation code encoder comprises a channel word conversion unit for transcoding the NRZ channel symbols into NRZI channel symbols by a one-dimensional 1T-precoding operation including an integration modulo 2, said 1T-precoding operation being carried out along said one-dimensional direction of infinite extent.

7. An encoding apparatus as claimed in claim 1,
wherein said modulation code encoder is adapted for implementing a radial and/or tangential k-constraint by adding further STD-states in said state transition diagram having no fan-out for predetermined NRZI channel symbols.

8. n encoding apparatus as claimed in claim 1,
wherein said modulation code encoder is adapted for use of enumerative encoding for modulation code encoding.

9. An encoding apparatus as claimed in claim 1,
wherein said modulation code encoder is adapted for implementing a high-rate code, in particular a 152 to 153 code.

10. An encoding apparatus as claimed in claim 1,
wherein the NRZI channel bits are arranged on the lattice points of a square or hexagonal lattice.

11. An encoding method for two-dimensionally encoding user data of a user data stream into channel data of a channel data stream along a two-dimensional channel strip of at least two bit rows one-dimensionally evolving along a first direction and being aligned with each other along a second direction, said two directions constituting a two-dimensional lattice of bit positions, said method comprising the step of modulation code encoding said user data into said channel data according to a two-dimensional modulation code being adapted to prevent predetermined worst case patterns of channel data in said channel data stream.

12. Computer program comprising program code means for causing a computer to perform the steps of the method as claimed in claim 11 when said computer program is executed on a computer.

13. Record carrier comprising two-dimensionally encoded user data of a user data stream into channel data of a channel data stream along a two-dimensional channel strip of at least two bit rows one-dimensionally evolving along a first direction and being aligned with each other along a second direction, said two directions constituting a two-dimensional lattice of bit positions, said method comprising the step of modulation code encoding said user data into said channel data according to a two-dimensional modulation code being adapted to prevent predetermined worst case patterns of channel data in said channel data stream.

14. Record carrier as claimed in claim 13 characterized in that said worst case pattern include local periodic patterns having fundamental frequency components outside the circle formed by the base of the two-dimensional optical modulation transfer function.

15. Record carrier as claimed in claim 13 characterized in that said worst case patterns include patterns forming a closed ring of bit symbols having alternating bit values or form an open ring of bit symbols having alternating bit values at a boundary of said channel data stream where the opening of the ring is at the side of the boundary.

16. Record carrier as claimed in claim 13 characterized in that the user data is encoded using a high-rate code, in particular a 152 to 153 code.

17. Record carrier as claimed in claim 13 characterized in that the channel data comprises NRZI channel bits arranged on the lattice points of a square or hexagonal lattice.

* * * * *